(12) United States Patent
Op 't Eynde et al.

(10) Patent No.: US 11,804,911 B2
(45) Date of Patent: *Oct. 31, 2023

(54) MEASUREMENT APPARATUS

(71) Applicant: NXP B.V., Eindhoven (NL)

(72) Inventors: Frank Op 't Eynde, Wilsele (BE); Olivier Crand, Parfouru sur Odon (FR); Milad Piri, Nijmegen (NL)

(73) Assignee: NXP B.V., Eindhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/811,983

(22) Filed: Jul. 12, 2022

(65) Prior Publication Data
US 2022/0360345 A1 Nov. 10, 2022

Related U.S. Application Data

(63) Continuation of application No. 17/392,334, filed on Aug. 3, 2021, now Pat. No. 11,424,840.

(30) Foreign Application Priority Data

Aug. 10, 2020 (EP) ..................................... 20305919

(51) Int. Cl.
*H04B 3/46* (2015.01)
*H04B 17/00* (2015.01)

(52) U.S. Cl.
CPC ................................ *H04B 17/0085* (2013.01)

(58) Field of Classification Search
CPC ........................ H04B 10/07955; H04B 3/46; H04B 17/0085; H04B 10/0777; H04B 14/068; H04B 14/046; H04B 2025/03585; H04Q 2011/0083; H04Q 2011/0015; H04L 27/34
USPC .......................................................... 375/244
See application file for complete search history.

(56) References Cited

U.S. PATENT DOCUMENTS

| | | | |
|---|---|---|---|
| 6,411,244 B1* | 6/2002 | Dobos ....................... | H03L 7/00 341/122 |
| 9,025,645 B2* | 5/2015 | Al-Qaq ................ | H04B 17/309 375/219 |
| 11,424,840 B2* | 8/2022 | Op 't Eynde ...... | H04B 17/0085 |
| 2008/0057899 A1* | 3/2008 | Montemayor ......... | H04B 17/21 455/255 |

* cited by examiner

*Primary Examiner* — Khai Tran

(57) ABSTRACT

A measurement apparatus comprising a first terminal to receive an input signal of a circuit under test; a second terminal to receive an output signal of the circuit under test. A first and second phase splitter configured to generate a first and second phase signal, I1 and I2, and a first and second quadrature signal, Q1 and Q2. A first and second multiplexer, each coupled to the first terminal and the second terminal and configured to alternately pass the input and output signals of the circuit under test to the inputs of the first and second phase splitters. A double-quadrature mixer having four inputs configured to receive I1, Q1, I2, and Q2, and an output. A calculation unit to determine one or both of a phase shift of the circuit under test and/or a gain of the circuit under test based on the output of the double-quadrature mixer.

20 Claims, 6 Drawing Sheets

MEASUREMENT APPARATUS

CROSS-REFERENCE TO RELATED APPLICATIONS

This Application is a continuation claiming benefit of the filing date of U.S. patent application Ser. No. 17/392,334 filed Aug. 3, 2021, and which claims the priority under 35 U.S.C. § 119 of European Patent application no. 20305919.1, filed on 10 Aug. 2020, the contents of each of which are incorporated by reference herein.

FIELD

The present disclosure relates to a measurement apparatus. The measurement apparatus may be used in the field of testing RF signal processing circuits. In particular, the present disclosure relates to a measurement apparatus for determining a phase shift and/or gain introduced by a circuit under test.

BACKGROUND

In RF signal processing a circuit may be configured to change a signal's amplitude wherein such a circuit may be termed an "amplifier". Furthermore, a circuit may be configured for changing a signal's phase wherein such a circuit may be termed a "Phase Rotator", "Phase Shifter" or "Delay circuit". These circuits may be formed as integrated circuits known generally as Radio Frequency Integrated Circuits (RFICs).

Due to variabilities in the production processes of these circuits, such as in RFICs, such Amplifiers and Phase Rotators might show production tolerances. As a result, the gain and/or phase of these blocks is not exactly known.

SUMMARY

According to a first aspect of the present disclosure there is provided a measurement apparatus comprising:
  a first terminal for coupling to a circuit under test to receive a first signal representative of the input signal to said circuit under test;
  a second terminal for coupling to the circuit under test to receive a second signal representative of output from said circuit under test;
  a first phase splitter configured to generate, based on the signal provided at an input of said first phase splitter, a first phase signal, I1, and a first quadrature signal, Q1, said first quadrature signal in quadrature with said first phase signal;
  a second phase splitter configured to generate, based on the signal provided at an input of said second phase splitter, a second phase signal, I2, and a second quadrature signal, Q2, said second quadrature signal in quadrature with said second phase signal;
  a first multiplexer coupled to the first terminal and the second terminal and configured, in a first mode of the first multiplexer, to pass the first signal to the input of the first phase splitter and, in a second mode of the first multiplexer, to pass the second signal to the input of the first phase splitter;
  a second multiplexer coupled to the first terminal and the second terminal and configured, in a first mode of the second multiplexer, to pass the second signal to the input of the second phase splitter and, in a second mode of the second multiplexer, to pass the first signal to the input of the second phase splitter;
  a double-quadrature mixer having four inputs configured to receive the first phase signal, I1, the first quadrature signal, Q1, the second phase signal, I2 and the second quadrature signal, Q2, and an output; and
  a calculation unit configured to receive the output of the double-quadrature mixer, the output comprising a pair of signals, and determine one or both of:
  a) a phase shift of the circuit under test based on the pair of signals at said output of the double-quadrature mixer, with said first multiplexer in the first mode and the second multiplexer in the first mode, and the pair of signals at said output with said first multiplexer in the second mode and the second multiplexer in the second mode;
  b) a gain of the circuit under test, comprising a ratio of the amplitude, B, of the second signal and the amplitude, A, of the first signal, based on the output of the double-quadrature mixer, with said first multiplexer in the first mode and the second multiplexer in the second mode, and the output of the double-quadrature mixer, with said first multiplexer in the second mode and the second multiplexer in the first mode.

In one or more examples, the pair of signals comprise:

$$I1 \cdot I2 + Q1 \cdot Q2; \text{ and} \quad (i)$$

$$I1 \cdot Q2 - I2 \cdot Q1. \quad (ii)$$

In one or more examples, the measurement apparatus includes one or both of: an averaging element configured to average each of the signals of the pair of signals prior to receipt by the calculation unit; and the calculation unit is configured to determine an average of each of the signals of the pair of signals provided at the output of the double-quadrature mixer; and wherein the phase shift and/or gain is determined based on said averages.

In one or more examples, the double quadrature mixer is configured to output the pair of signals at different times and may be configured to output them consecutively.

In one or more embodiments the measurement apparatus is configured to determine the phase shift of the circuit under test, wherein the calculation unit is configured to determine, based on the pair of signals at the output of the measurement apparatus, with said first multiplexer in the first mode and the second multiplexer in the first mode, the following:
  a first average value, M1, of I1·I2+Q1·Q2; and
  a second average value, M2, of I1·Q2−I2·Q1; and
  the calculation unit is configured to determine, based on the pair of signals at said output of the measurement apparatus, with said first multiplexer in the second mode and the second multiplexer in the second mode, the following:
  a third average value, M3, of I1·I2+Q1·Q2;
  a fourth average value, M4, of I1·Q2−I2·Q1;
  wherein the phase shift of the circuit under test is given by:

$$\frac{1}{2}\left\{a\tan\left(\frac{M2}{M1}\right) - a\tan\left(\frac{M4}{M3}\right)\right\}.$$

In one or more embodiments the measurement apparatus is configured to determine the phase shift of the circuit under test, the calculation unit is configured to determine the following:

a reference average value, M0, based on the output of the double quadrature mixer, in which the measurement apparatus is configured such that one of: the inputs to the double-quadrature mixer are disconnected from the first and second phase splitter or the first signal and the second signal are set to zero; and wherein the phase shift of the circuit under test comprises:

$$\frac{1}{2}\left\{a\tan\left(\frac{M2-M0}{M1-M0}\right) - a\tan\left(\frac{M4-M0}{M3-M0}\right)\right\}.$$

It will be appreciated that the reference average value M0 is intended to determine the effect of the measurement apparatus on the signals passing therethrough and, in particular, the effect of the double quadrature mixer. As such this may be achieved by interrupting the first and second signal at any point prior to the double quadrature mixer.

In one or more embodiments the calculation unit is configured to determine the following average values to determine the gain of the circuit under test:

a fifth average value, M5, of one of said pair of signals provided at said output of the double-quadrature mixer, wherein the first multiplexer is in the first mode and the second multiplexer is in the second mode, comprising I1·I2+Q1·Q2;

a sixth average value, M6, of one of said pair of signals provided at said output of the double-quadrature mixer, wherein the first multiplexer is in the second mode and the second multiplexer is in the first mode, comprising I1·I2+Q1·Q2; and wherein the gain comprises:

$$\text{Gain} = \frac{B}{A} = \sqrt{\frac{M6}{M5}}.$$

In one or more embodiments the calculation unit is configured to determine the gain of the circuit under test by determining the further average value comprising:

a reference average value, M0, based on the output of the double quadrature mixer, in which the measurement apparatus is configured such that one of: the inputs to the double-quadrature mixer are disconnected from the first and second phase splitter or the first signal and the second signal are set to zero; and wherein the gain comprises:

$$\text{Gain} = \frac{B}{A} = \sqrt{\frac{M6-M0}{M5-M0}}.$$

In one or more embodiments the calculation unit is configured to determine the gain of the circuit under test by determining the further average value comprising:

a reference average value, M0, based on the output of the double quadrature mixer, in which the measurement apparatus is configured such that one of: the inputs to the double-quadrature mixer are disconnected from the first and second phase splitter or the first signal and the second signal are set to zero; and wherein the gain comprises:

$$\text{Gain} = \frac{B}{A} = \frac{M6-M0}{\sqrt{(M1-M0)^2 + (M2-M0)^2}}.$$

In one or more embodiments the calculation unit is configured to determine the following average values to determine the signal power of the first signal provided to the circuit under test:

a fifth average value, M5, of one of said pair of signals provided at said output of the double-quadrature mixer, wherein the first multiplexer is in the first mode and the second multiplexer is in the second mode, comprising I1·I2+Q1·Q2, a reference average value, M0, based on the output of the double quadrature mixer, in which the apparatus is configured such that one of: the inputs to the double-quadrature mixer are disconnected from the first and second phase splitter or the first signal and the second signal are set to zero; and wherein the signal power of the first signal comprises:

=$f_c$(M5–M0);

where $f_c$ comprises a function based on predetermined calibration data that accounts for the signal power introduced by the measurement apparatus.

In one or more embodiments the calculation unit is configured to determine the following average values to determine the signal power of the second signal provided to the circuit under test:

a sixth average value, M6, of said output wherein the first multiplexer is in the second mode and the second multiplexer is in the first mode, comprising I1·I2+Q1·Q2; and a reference average value, M0, in which the apparatus is configured such that one of: the inputs to the double-quadrature mixer are disconnected from the first and second phase splitter or the first signal and the second signal are set to zero; and wherein the signal power of the first signal comprises:

=$f_c$(M6–M0);

wherein $f_c$ comprises a function based on predetermined calibration data that accounts for the signal power introduced by the measurement apparatus.

In one or more embodiments the calibration data is determined based on the measurement apparatus having been provided with a signal of known signal power at both the first multiplexer and the second multiplexer and wherein the calibration data is determined based on one or both of:

a value, M5, of one of said pair of signals provided at said output of the double-quadrature mixer, wherein the first multiplexer is in the first mode and the second multiplexer is in the second mode, comprising I1·I2+Q1·Q2;

a value, M6, of one of said pair of signals provided at said output of the double-quadrature mixer, wherein the first multiplexer is in the second mode and the second multiplexer is in the first mode, comprising I1·I2+Q1·Q2.

In one or more embodiments an AC coupler is provided at one or more of the input of the first multiplexer, the input of the second multiplexer, the input of the first phase splitter, the input of the second phase splitter, an output of the first phase splitter and an output of the second phase splitter.

In one or more embodiments the double quadrature mixer comprises:

a first mixer configured to receive I1 from the first phase splitter and an output of a first multiplexer;

a second mixer configured to receive Q1 from the first phase splitter and an output of a second multiplexer;

wherein the output of the first mixer and the output of second mixer are coupled with a summing element configured to determine a sum of the outputs of the first and second mixers and provide it to the output of the double quadrature mixer; and wherein the first multiplexer is configured, in a first mode, to select I2 and, in a second mode, to select Q2 to provide to the first mixer; and the second multiplexer is configured, in a first mode, to select Q2 and, in a second mode, to select -I2 to provide to the second mixer.

In one or more embodiments the mixers of the double quadrature mixer comprise Gilbert multipliers.

In one or more embodiments the first phase splitter and/or the second phase splitter are based on a polyphase filter.

In one or more embodiments, one or both of:

for determining the phase shift of the circuit under test, the calculation unit includes an analog-to-digital converter to convert the output of the double quadrature mixer to a digital signal for processing by the calculation unit; and for determining the gain of the circuit under test, the calculation unit includes a voltmeter to determine the voltage at the output of the double quadrature mixer for processing by the calculation unit.

In one or more embodiments, the calculation unit may include a switch to switch between the ADC and the voltmeter.

In one or more embodiments, the first and second phase splitters are formed on same integrated circuit.

In one or more embodiments, the measurement apparatus comprises a built-in self-test circuit for the circuit under test.

In one or more examples, one of:

the phase shift of the circuit under test is provided to a calibration unit configured to calibrate the circuit under test based on said phase shift;

the gain of the circuit under test is provided to a calibration unit configured to calibrate the circuit under test based on said phase shift.

According to a second aspect of the present disclosure there is provided an electronic device including the measurement circuit of any preceding claim, the electronic device comprising a 5G New Radio transceiver, wherein the circuit under test comprises part of one of a transmission path or a receive path of said transceiver.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A measurement apparatus may be developed to measure the effect a circuit under test has on a signal. Thus, the circuit under test may receive an input signal and output an output signal. The output signal, by virtue of the functionality of the circuit under test, may differ from input signal in terms of one or both of amplitude or phase by way of the gain applied by the circuit under test or the degree of phase rotation applied by the circuit under test. In other examples, the circuit under test may be configured not to apply a gain and/or phase rotation to the input signal and imperfections in the fabrication processes may lead such a gain and/or phase rotation to occur in practice. The measurement apparatus may be implemented as a built-in-self-test (BIST) on the same integrated circuit (IC) as the circuit under test. This "Built-In Self-Test" (BIST) measurement apparatus aids in testing the main circuits (i.e. circuit under test) of the IC or, wherein the input signal is alternating, RFIC.

Measurement apparatus can also be used to modify the gain of the circuit under test and/or the insertion phase of the input signal to the circuit under test, either during production or during the operational lifetime of the circuit. Accordingly, in one or more examples, the measurement apparatus may be configured to provide a feedback signal configured to modify one or both of the gain of the circuit under test, the phase shift implemented by the circuit under test (which may or may not be intended) or provide for the modification of the input signal to compensate for the phase shift and/or gain provided by the circuit under test on the input signal.

BIST measurement apparatus can suffer from production tolerances, in a way that is similar to the production tolerances of amplifiers and phase rotator components that they may be configured to test. As a result, the measurements performed by the measurement apparatus are not perfect but may contain some measurement errors. The whole BIST approach relies on the underlying assumption that the tolerances on these measurements are smaller than the original tolerances on the circuit(s) under test. In one or more examples, it may be important that the measurement of the phase and gain of the circuit under test by the BIST hardware can be determined accurately and can be done in such a way as to negate any effects due to the production tolerances of the BIST hardware.

We will now describe a series of circuits that may be used as a test circuit, such as a BIST circuit, and then describe a plurality of embodiments of a measurement apparatus that comprises embodiments of the disclosure.

Figure 1:
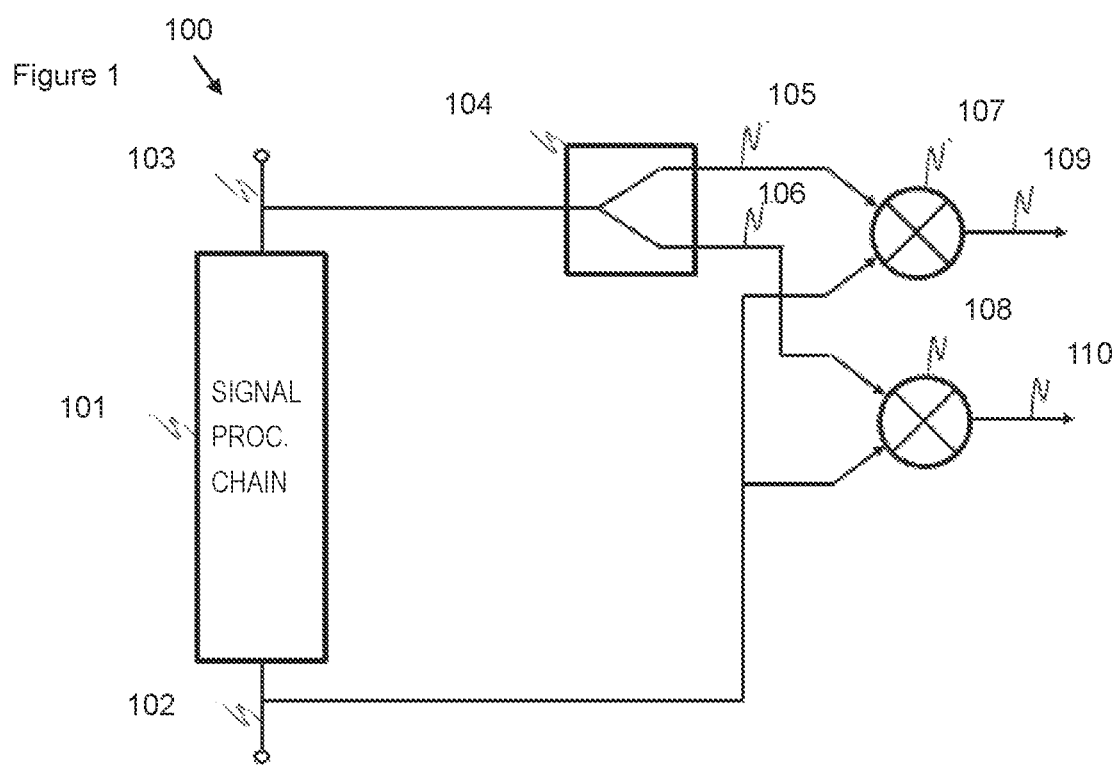
FIG. 1 illustrates an example circuit, which may comprise a Build-In-Self-Circuit under test, for determining the phase change of an output of a circuit under test, which comprises a signal processing chain in this example, relative to the input to the circuit under test.

FIG. 1 illustrates a combination 100 of a circuit under test and a testing circuit (which may comprise a BIST circuit) coupled thereto. The circuit under test comprises a signal processing chain 101. Such a signal processing chain may comprise linear circuits commonly used in RFICs, such as amplifiers, phase rotators, filters, attenuators, couplers, etc.

The signals present at the respective input and output terminals of the signal processing chain will be referred to as an input signal at input terminal 102 and an output signal at output terminal 103, respectively. The input signal and the output signal will be referred to as having amplitudes denoted by "A" and "B", respectively and a relative phase difference denoted by $\varphi$ in the description that follows.

The gain of the signal processing chain 101 can be measured by measuring the ratio of the magnitude of the output signal and the input signal, i.e. B/A. The phase change introduced by the signal processing chain can be measured by measuring the phase difference $\varphi$ between the input signal and the output signal of the signal processing chain 101. Therefore, the gain and phase introduced by the signal processing chain can be measured by observing the input signal at input terminal 102 and the output signal at output terminal 103.

The testing circuit of FIG. 1 further contains a phase splitter 104 for obtaining two quadrature signal components from the output signal. These quadrature signals consist of signal "I" represented by the output 105 and "Q" represented by the output 106, the two quadrature signals have phases of $\varphi+45°$ and $\varphi-45°$, respectively, with respect to the Input signal phase. Such a phase splitter may be built with a polyphase filter, as will be well-known by those skilled in the art.

Furthermore, the testing circuit of FIG. 1 contains two mixers 107 and 108. A mixer is a circuit component that produces a mixer output signal at mixer output terminals 109 and 110 that is proportional to the product of the signal received at each of its two input terminals. In relation to FIG. 1:

the mixer output signal at output terminal 109 is the product of the input signal at 102 and one of the quadrature signals from the output 105 of the phase splitter.

the mixer output Signal 110 is the product of input signal at 102 and one of the quadrature signals from the output 106 of the phase splitter.

It can be calculated that the average values of these two mixer output signals are given by:

average of signal at the mixer output terminal 109 = $A \cdot B \cdot \cos(\varphi+45°)$;

average of signal at the mixer output terminal 110 = $A \cdot B \cdot \cos(\varphi-45°) = A \cdot B \cdot \sin(\varphi+45°)$.

Therefore, the phase $\varphi$ can be derived from measurements of the averages of mixer output signals at mixer output terminals 109 and 110:

$$\frac{\text{average of signal at mixer output terminal 110}}{\text{average of signal at mixer output terminal 109}} = \quad \text{(eq. 1)}$$

$$\frac{A \cdot B \sin(\varphi + 45°)}{A \cdot B \cos(\varphi - 45°)} = \tan(\varphi + 45°);$$

$$\varphi = a\tan\left(\frac{\text{average of signal at mixer output terminal 110}}{\text{average of signal at mixer output terminal 109}}\right) - 45°. \quad \text{(eq. 2)}$$

The modulo-180° result, produced by the "a tan" function can be transformed into a modulo-360° by considering the sign of $\sin(\varphi+45°)$, i.e. the sign of the average of signal at mixer output terminal 110.

This measurement principle offers the advantage that it is independent of the amplitudes of the input signal and output signal, A and B respectively. Indeed, both the numerator and the denominator of the ratio in between the brackets of eq. 2 are proportional to A and B. Hence, A and B cancel out. Similarly, the measurement result is independent of the gain factors of the two mixer means, provided that these two gain factors are equal.

However, the testing circuit of FIG. 1 may suffer from multiple issues that affect the accuracy of its output by introducing measurement errors wherein these errors can be due to one or more of:

a) The gains of each mixer can be different.
b) The phase splitter 104 can introduce an additional phase in the signal path. This phase might be poorly controllable. This additional phase would add to the measured result.
c) Due to circuit imperfections in the phase splitter 104, the two output signals 105 and 106 might have different amplitudes. This will cause measurement errors, due to incomplete cancellation of the amplitudes.
d) Due to circuit imperfections in the Phase Splitter 104, the phase difference between the quadrature signals at terminals 105 and 106 might not be exactly 90°. This will also cause measurement errors.
e) The mixers 107 and 108 might introduce additional phases in the signal paths from their two inputs to their outputs. When the additional phase in the signal path from one input to an output is different from the additional phase from the other input to the same output, this will influence the measurement result and therefore cause a measurement error.
f) All circuits in FIG. 1 can produce DC offset voltages that contribute to measurement errors.

We will now describe changes to the circuit under test 100 which, in one or more examples, may address the possible measurement issues identified above. It should be noted that corresponding features in subsequent figures utilise equivalent reference numerals with a different first numeral to correspond to the figure it refers to.

a) The gains of both mixers can be different.

Each mixer 107 and 108 in FIG. 1 might have a different signal gain. For example, the gain of mixer 107 might be too large by a factor 1+δ, whereby δ represents the mixer gain imbalance. Ideally, δ equals zero. As a result, eq. 1 becomes:

$$\frac{\text{average of signal at mixer output terminal 110}}{\text{average of signal at mixer output terminal 109}} = \qquad \text{(eq. 3)}$$

$$\frac{A.B(1+\delta).\sin(\varphi+45°)}{A.B\cos(\varphi-45°)} = \tan(\varphi+45°).$$

Hence, when φ is calculated using eq. 2, this becomes:

$$\varphi = a\tan\left(\frac{\text{average of signal at mixer output terminal 110}}{\text{average of signal at mixer output terminal 109}}\right) - 45° =$$

$$a\tan((1+\delta).\tan(\varphi+45°)) - 45° \approx \varphi + \cos(2\varphi).\frac{\delta}{2}.$$

As can be seen from the above equation, the calculated measurement result can differ from the ideal result φ. The measurement error is approximately equal to cos(2φ)·δ/2. E.g. for a gain error δ of 5%, the measurement error can be as large as 0.025 radians, which is equal to 1.5°.

Figure 2:
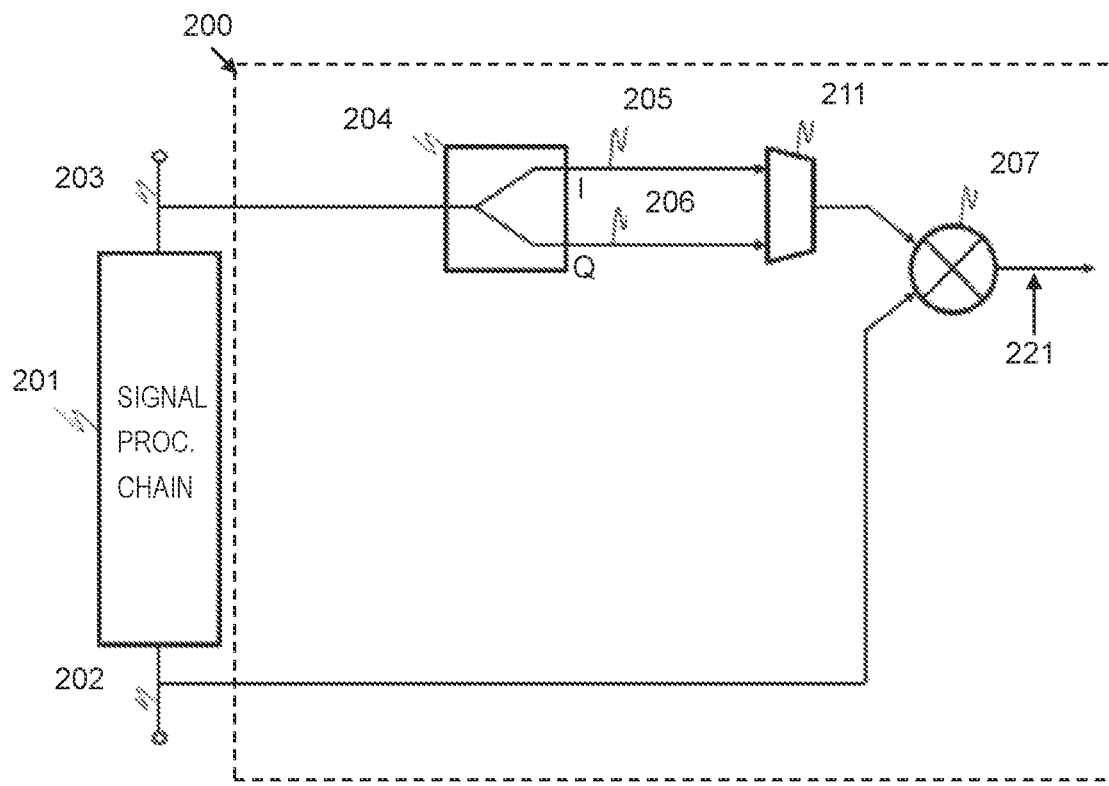
FIG. 2 illustrates an alternative example circuit which utilises only a single mixer component.

This problem may be solved with the example testing circuit 200 (bounded by a dashed box) of FIG. 2. This setup contains only one mixer 207. The testing circuit 200 also contains a signal multiplexer 211. This multiplexer can be configured into two configurations:

in a first configuration, a first output 205 of the phase splitter 204 is connected to the input of mixer 207 and thereby provides a first of the two quadrature signals to the mixer 207.

in a second configuration, a second output 206 of the phase splitter 204 is connected to the input of mixer 207 and thereby provides a second of the two quadrature signals to the mixer 207.

Two measurements are performed, one after the other, at two different times:

at one time instant, a first of the quadrature signals from output 205 is connected to mixer 207, and the average of the product between the input signal from input terminal 202 and said first of the quadrature signals from output 205 is measured. This measurement result is equivalent to the average of signal output at 109 in FIG. 1.

at another time instant, a second of the quadrature signals from output 206 is connected to mixer 207, and the average of the product between the input signal from input terminal 202 and said second of the quadrature signals from output 206 is measured. This measurement result is equivalent to the average of signal 110 in FIG. 1.

The average of the mixer output signals 109 and 110 may comprise the mean average value.

Then, the phase φ can be calculated according to eq. 1 and eq. 2. But since both measurements are performed by the same mixer 207, the gain error δ in eq. 3 is zero.

b) The Phase Splitter 204 could introduce an additional phase in the signal path.

Figure 3:
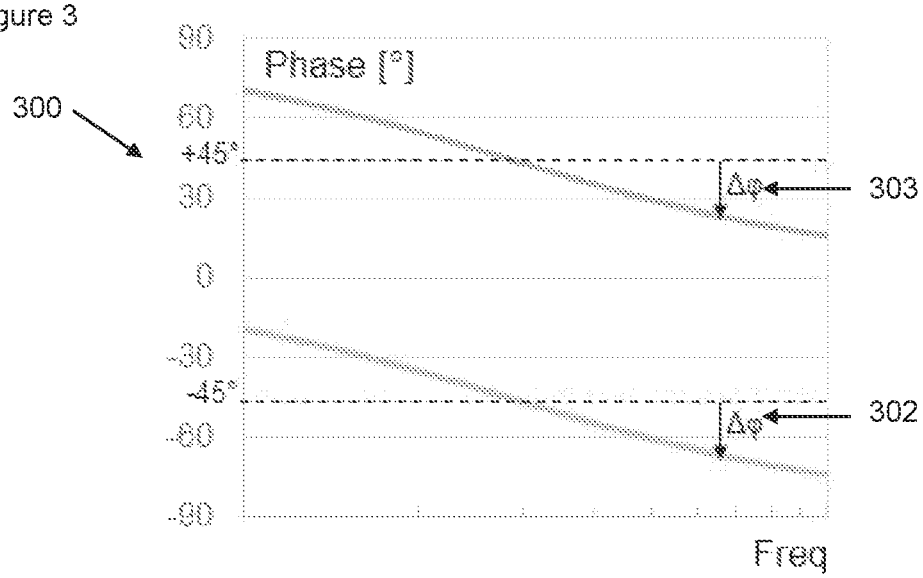
FIG. 3 shows an example graph illustrating the phases of a pair of quadrature signals output from a phase splitter relative to frequency.

In the examples described herein the output from the phase splitter 204 at output terminal 205 will be termed signal I and the output from the phase splitter 204 at output terminal 206 will be termed Q. I and Q have phases of (φ+45°) and φ−45°, respectively, with respect to the phase of the input signal at input terminal 202. However, when the phase splitter 204 is constructed as a Polyphase filter, the real phases are as depicted in the graph 300 of FIG. 3 where the phase difference between I and Q is still 90°, but each of the signals suffers from an error phase Δφ 302 and 303. Hence, the phases of I and Q are φ+45°+Δφ and φ−45°+Δφ, respectively. The error phase Δφ is poorly controlled and is frequency-dependent.

Under these circumstances, see FIG. 2:

average of mixer output signal at mixer output terminal 221, with multiplexer 211 in the first configuration=A·B·cos(φ+45°+Δφ), average of mixer output signal at mixer output terminal 221, with multiplexer 211 in the second configuration=A·B·cos(φ−45°+Δφ)=A·B·sin(φ+45°+Δφ).

As a result, when the phase φ is calculated according to eq. 2, the result is φ+Δφ. Hence, this error phase Δφ causes an error on the final calculated result.

Figure 4:
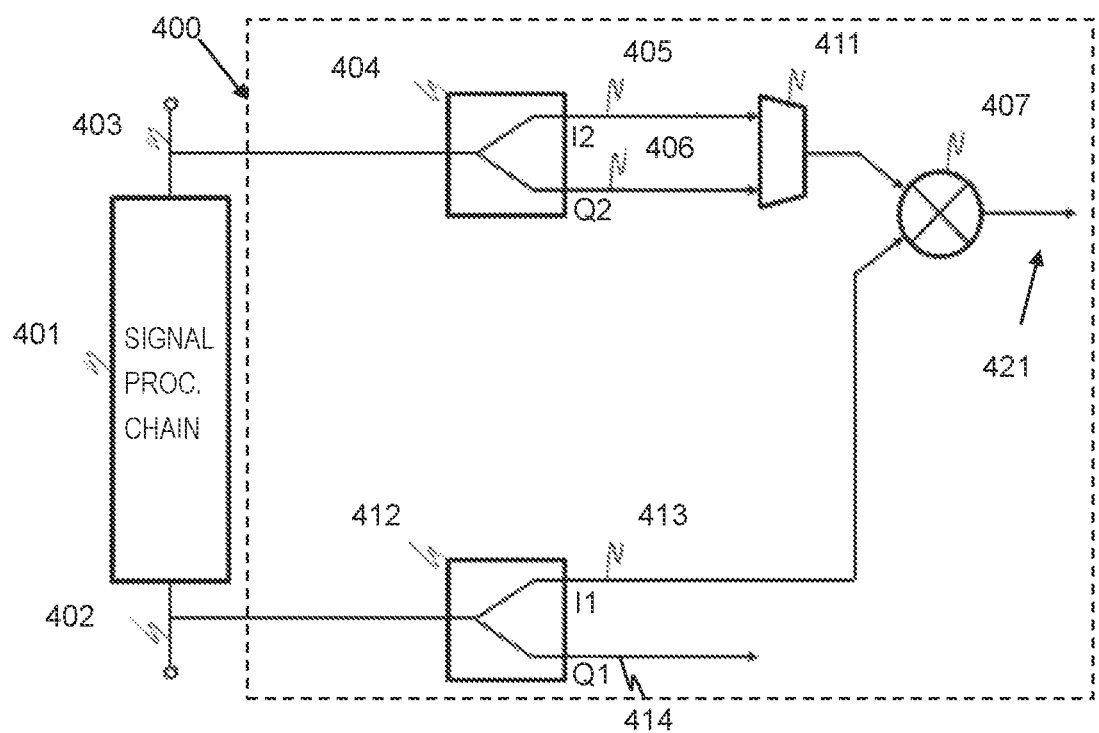
FIG. 4 illustrates an example circuit for determining the phase change of an output of a circuit under test, which comprises a signal processing chain in this example, relative to the input to the circuit under test, using two phase splitters, a single mixer component and a multiplexer to feed the single mixer component.

A further circuit under test 400 is shown in FIG. 4. Here, a second phase splitter 412 is introduced. Thus, in this example, the phase splitter coupled to the input terminal 402 will be referred to as the first phase splitter 412. The phase splitter coupled to the output terminal 403 will be referred to as the second phase splitter 404. The first and second phase splitters may be configured to provide two quadrature signals, similar to the phase splitter 204 of FIG. 2. The pair of quadrature signals output by the first phase splitter 412 will be referred to as I1 and Q1, output at terminals 413 and 414 respectively. The pair of quadrature signals output by the second phase splitter 404 will be referred to as I2 and Q2, output at terminals 405 and 406 respectively. As a result:

Phase of signal I1 is 45°+Δφ.
Phase of signal I2 is φ+45°+Δφ.
Phase of signal Q2 is φ−45°+Δφ.

Under these circumstances we can obtain two average signals comprising:

a first average signal: which is the average of the signal output at the mixer output 421 when the multiplexer selects I2 to pass to the mixer 407=A·B·cos(φ), a second average signal: which is the average of the signal output at the mixer output 421 when the multiplexer selects Q2 to pass to the mixer 407=A·B·cos(φ−90°)=A·B·sin(φ).

The phase φ can then be measured as:

$$\varphi = a\tan\left(\frac{\text{the second average signal at output terminal 421}}{\text{the first average signal at output terminal 421}}\right). \quad \text{eq. 4}$$

As long as both phase splitters are essentially equal in terms of the changes in phase they invoke in the quadrature signals, the result is independent of the error phase Δφ.

c) Due to circuit imperfections in phase splitter 404, the two signals I2 and Q2 provided at output terminals 405 and 406 might have a different amplitude.

Consider the testing circuit 400 of FIG. 4, whereby the amplitude of signal Q2 is too large by a factor 1+δ. Where δ represents the amplitude imbalance between signals I2 and Q2. Ideally, δ equals zero. As a result, calculating the phase φ by means of eq. 4. becomes:

$$a\tan\left(\frac{\text{the second average signal at output terminal 421}}{\text{the first average signal at output terminal 421}}\right) =$$

$$a\tan\left(\frac{A.B.\sin(\varphi).(1+\delta)}{A.B.\cos(\varphi)}\right) \approx \varphi + \sin(2\varphi).\frac{\delta}{2}.$$

Again, a non-zero amplitude imbalance δ might cause an error on the final calculated result. E.g. for an amplitude imbalance δ of 5%, the measurement error can be as large as 0.025 radians, which is equal to 1.5°.

Figure 5:
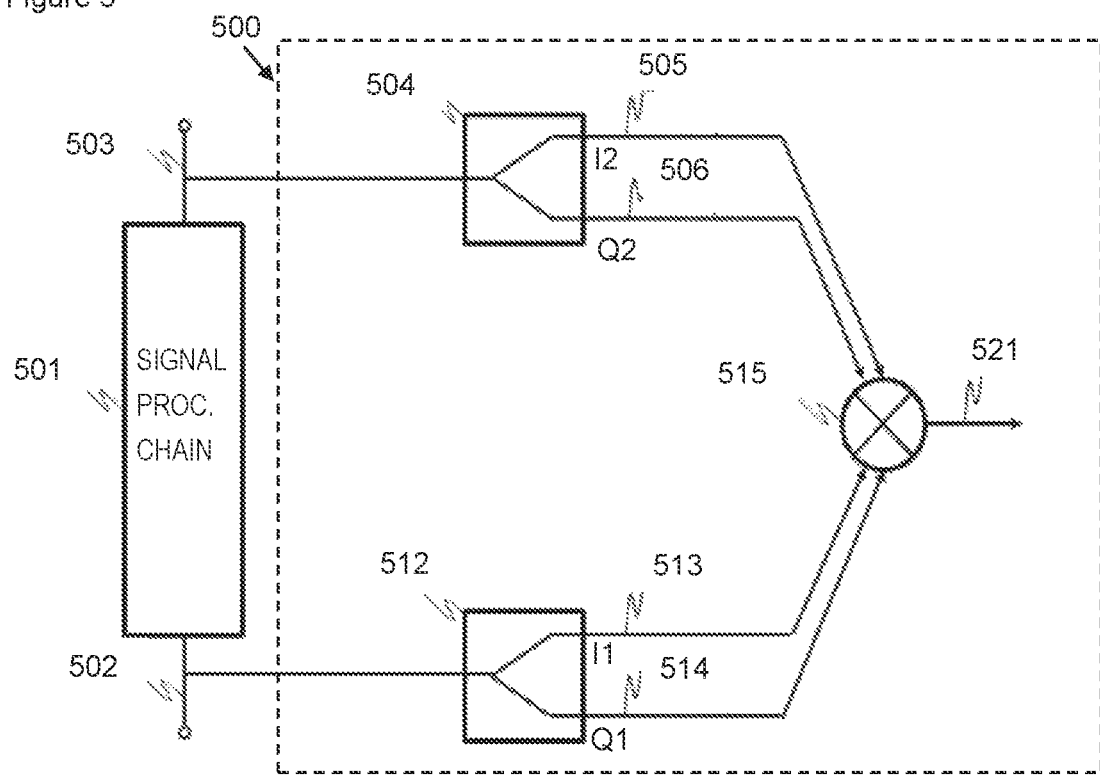
FIG. 5 illustrates an example circuit for determining the phase change of an output of a circuit under test, which comprises a signal processing chain in this example, relative to the input to the circuit under test using two phase splitters and a double quadrature mixer arrangement.

A further testing circuit 500 is depicted in FIG. 5. It contains a "Double-Quadrature Mixer" 515, well-known to the those skilled in the art. Such mixer means has four signal inputs. It allows performing two measurements:

$$M1 = \text{average}(I1 \cdot I2 + Q1 \cdot Q2).$$

$$M2 = \text{average}(I1 \cdot Q2 - I2 \cdot Q1).$$

The signals I1 provided at output 513, Q1 provided at output 514, I2 provided at output 505 and Q2 provided at output 506 are obtained from the two phase splitters 504 and 512.

The phases of these four signals, with respect to the phase of the input signal at input terminal (502), are respectively:
- phase of I1=45°.
- phase of Q1=−45°.
- phase of I2=φ+45°.
- phase of Q2=φ−45°.

The phase can then be calculated as:

$$a\tan\left(\frac{M2}{M1}\right) = a\tan\left(\frac{\text{average }(I1*Q2 - Q1*I2)}{\text{average }(I1*I2 + Q1*Q2)}\right) =$$

$$a\tan\left(\frac{A.B\cos(\varphi - 90°) - A.B.\cos(\varphi + 90°)}{A.B.\cos(\varphi) + A.B.\cos(\varphi)}\right) = \varphi. \quad \text{eq. 5}$$

Figure 6:
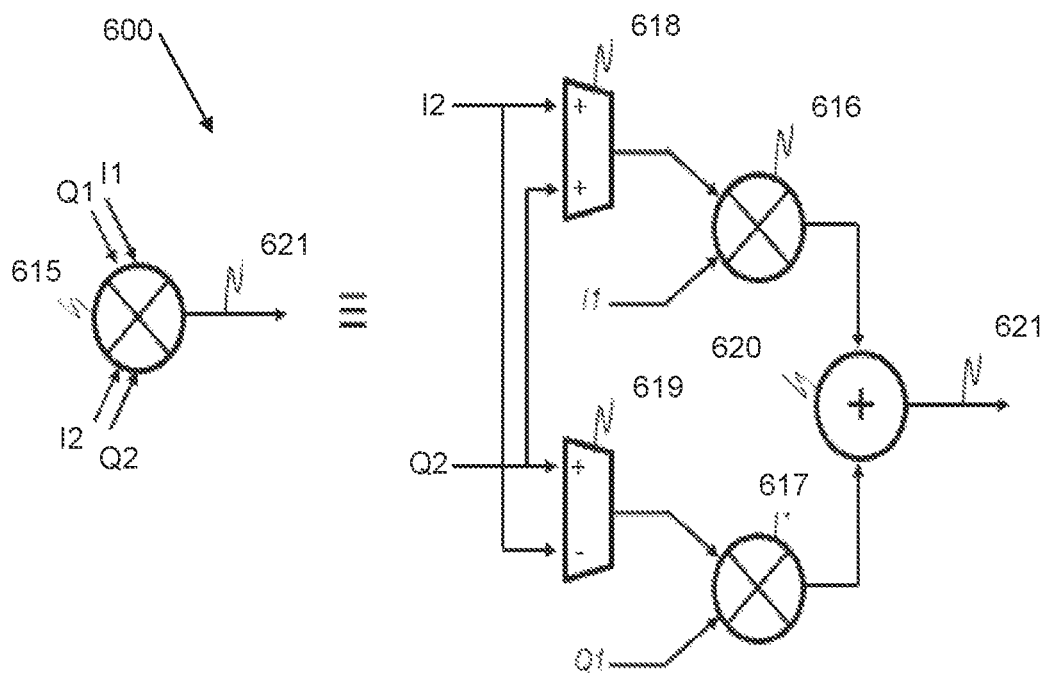
FIG. 6 illustrates an example circuit for forming a double quadrature mixer arrangement.

An example embodiment of the "Double-Quadrature Mixer" 600 is depicted in FIG. 6. This contains two mixers 616 and 617 and two multiplexers 618 and 619. The multiplexer 618 connects either signal I2 or Q2 to one input of first mixer 616, while multiplexer 619 connects either signal Q2 or −I2 to one input of the second mixer 617.

The example double quadrature mixer circuit contains further a summing element 620 configured to provide an output signal 621 that is the sum of the output signals of the first and second mixers 616 and 617. The summing element 620 may comprise a resistive load that sums input currents of previous components, as represented by the dashed box labelled as 620 in FIG. 8.

As a result, the circuit of FIG. 6 can be configured into two configurations:
- In one configuration, the output of the summing element at 621=I2*I1+Q2·Q1;
- In another configuration, the output of the summing element at 621=Q2*I1+(−I2)·Q1.

It can be appreciated that this corresponds to measurements M1 and M2, described above, respectively.

In order to investigate the influences of signal amplitude impairments, consider again the situation where the amplitude of Q2 is too large, by a factor 1+δ. Eq. 5. now becomes:

$$a\tan\left(\frac{M2}{M1}\right) = a\tan\left(\frac{A.B\cos(\varphi - 90°).(1 + \delta) - A.B.\cos(\varphi + 90°)}{A.B.\cos(\varphi) + A.B.\cos(\varphi)(1 + \delta)}\right) \approx \varphi.$$

As can be seen, signal Q2 appears in the numerator and in the denominator of this expression. No error on the calculated result is produced by the amplitude impairment δ.

Essentially similar calculations show that amplitude impairments of the signals I1, I2 or Q1 produce no measurement errors.

In conclusion, by using a Double-Quadrature mixer, the calculated end result becomes in a first order insensitive to amplitude impairments of the signals I1 provided at output 513, Q1 provided at output 514, I2 provided at output 505 and Q2 provided at output 506.

d) Due to circuit imperfections in Phase Splitters 504 or 512, the phase difference between signals I2 and Q2 or between I1 and Q1 might be not exactly 90°.

Consider the testing circuit 500 of FIG. 5. It might be that the phase splitters 504 and 512 are not fully identical, due to production tolerances. Therefore, it might be that the phase of one or more of the signals I1 provided at output 513, Q1 provided at output 514, I2 provided at output 505 and Q2 provided at output 506 deviates from the expected value. Consider for example the situation whereby the phase of signal Q2 exhibits a phase error Δφ. Ideally, Δφ equals zero. As a result, the phases of the four signals I1, Q1, I2 and Q2 with respect to the phase of the input signal (502) become:
- phase of I1=45°.
- phase of Q1=−45°.
- phase of I2=φ+45°.
- phase of Q2=φ−45°+Δφ.

Calculating the phase φ by means of eq. 5. now becomes:

$$a\tan\left(\frac{M2}{M1}\right) = \left(\frac{\text{average }(I1*Q2 - Q1*I2)}{\text{average }(I1*I2 + Q1*Q2)}\right) =$$

$$a\tan\left(\frac{A.B\cos(\varphi - 90° + \Delta\varphi) - A.B.\cos(\varphi + 90°)}{A.B.\cos(\varphi) + A.B.\cos(\varphi + \Delta\varphi)}\right) = \varphi + \frac{\Delta\varphi}{2}.$$

Hence, the phase error Δφ causes an error on the final calculated result, approximately equal to 50% of Δφ. E.g. when Δφ is 5°, the resulting measurement error is approximately 2.5°. Similar calculations reveal that phase errors Δφ on signals I1, I2 or Q2 cause errors on the final calculated result that are either plus or minus 50% of the original phase error Δφ.

Figure 7:
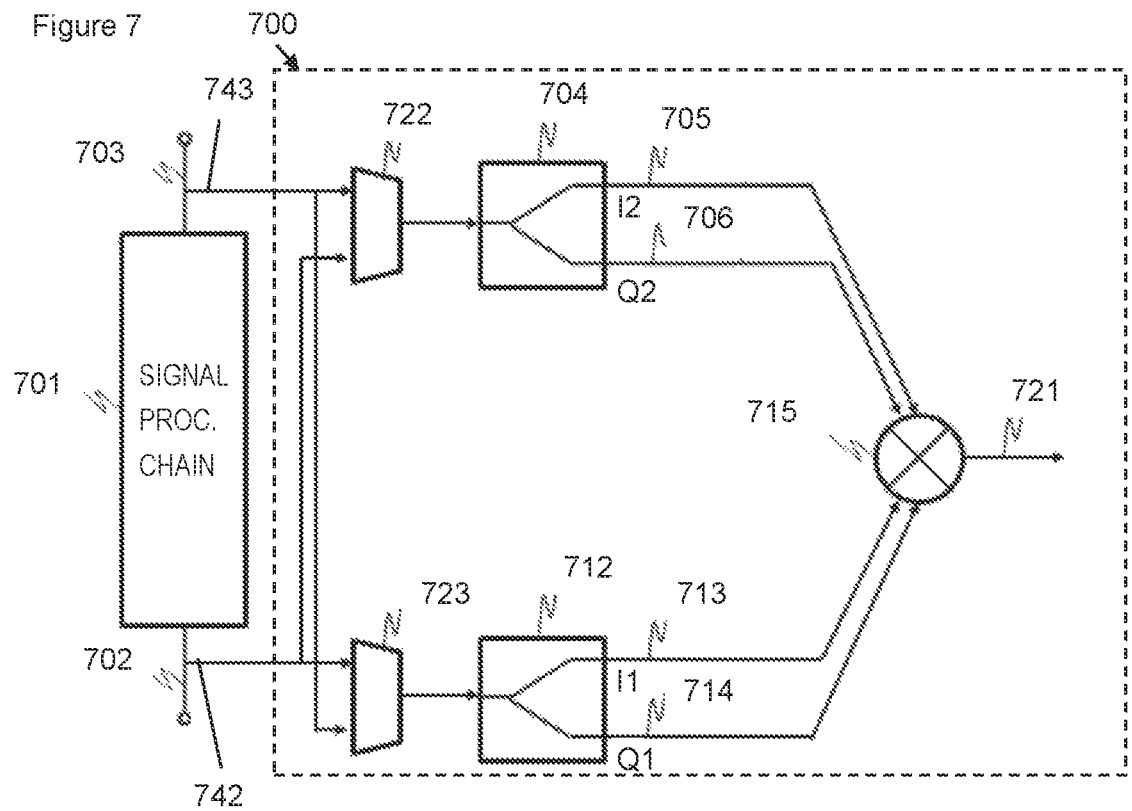
FIG. 7 shows an example embodiment of the measurement apparatus having two multiplexers to feed the two phase splitters, coupled to a circuit under test comprising, which, in this example is a signal processing chain.

A measurement apparatus 700 comprising an example embodiment of the disclosure is depicted in FIG. 7. Compared to FIG. 5, two multiplexers 722 and 723 are provided. There is provided a first multiplexer 723 coupled to the first terminal 702 for receiving the input signal and the second terminal 703 for receiving the output signal. There is provided a second multiplexer 722 coupled to the second terminal 703 for receiving the output signal and the first terminal 702 for receiving the input signal. These multiplexers can be configured to operate in two different configurations:

In one configuration, the output signal of the circuit under test is connected to the second phase splitter 704 while the input signal to the circuit under test is connected to first phase splitter 712.

In another configuration, the multiplexers are configured to pass the other of the signals at their inputs, whereby the input signal of the circuit under test is routed to the second phase splitter 704 while the output signal of the circuit under test at 703 is connected to first phase splitter 712.

This implies, in the ideal situation where the phases of all signals I1 provided at output 713, Q1 provided at output 714, I2 provided at output 705 and Q2 provided at output 706 are ideal:

In the first configuration:
- phase of I1=45° with respect to the phase of the input signal.
- phase of Q1=−45° with respect to the phase of the input signal.

phase of I2=φ+45° with respect to the phase of the input signal.
phase of Q2=φ−45° with respect to the phase of the input signal.

In the second configuration:
phase of I1=φ+45° with respect to the phase of the input signal.
phase of Q1=φ−45° with respect to the phase of the input signal.
phase of I2=45° with respect to the phase of the input signal.
phase of Q2=−45° with respect to the phase of the input signal.

Now, four measurements can be performed: two with the first and second multiplexers in the aforementioned first configurations (M1 and M2) and two with the first and second multiplexers in the aforementioned second configurations (M3 and M4):

M1=average(I1·I2+Q1·Q2), in the first configuration.
M2=average(I1·Q2−I2·Q1), in the first configuration.
M3=average(I1·I2+Q1·Q2), in the second configuration.
M4=average(I1·Q2−I2·Q1), in the second configuration.

It should be noted that the averaging may be done at the time of taking the measurements using a passive averaging element or alternatively the averaging may be achieved by a separate unit, such as a calculation unit that performs the following calculations, once the measurements have been taken. The averaging may therefore be performed in the analog or digital domains.

The average of the signal at 721 may comprise the mean average value.

Thus, the measurement apparatus 700 may include one or both of an averaging element, such as an integrator or an ADC with a low cut-off frequency, and a calculation unit coupled to the output 721 of the double quadrature mixer.

Thus, in some examples, the calculation unit may be configured to sample the output of the double quadrature mixer 715 a predetermined number of times or for a predetermined time period and determine a mean average from the samples. In other examples, the calculation unit may not actively take an average of the output of the double quadrature mixer. In one or more examples, the output of the double quadrature mixer may be received by an analog-to-digital converter, ADC, (as will be described in relation to FIG. 10) wherein the cut-off frequency of the ADC is set to that inherently averages the output of the double quadrature mixer 715, 1015. In other examples, an averaging element based on filters or integrators at the output of the double quadrature mixer may be provided.

To summarise FIG. 7, there is provided, in one or more embodiments, a measurement apparatus 700 for measuring one or both of the phase difference and the amplitude ratio (i.e. gain) provided by the circuit under test 701 to the input signal input at the input terminal 702 with respect to the output signal at the output terminal 703.

The measurement apparatus 700 comprises a first terminal 742, which in this example is for coupling the input terminal 702 of the circuit under test 701 to the measurement apparatus 700, to receive a first signal representative of the input signal to said circuit under test. It will be appreciated that in this example, the input to the measurement apparatus 700 at the first terminal is same as the input to the circuit under test 701. However, in other examples, the terminal 742 may be coupled to the input terminal 702 via one or more other components.

The measurement apparatus 700 further comprises a second terminal 743, which in this example is for coupling the output terminal 703 of the circuit under test 701 to the measurement apparatus 700, to receive a second signal representative of output from said circuit under test. It will be appreciated that in this example, the input to the measurement apparatus 700 at the second terminal is same as the output from the circuit under test 701. However, in other examples, the terminal 743 may be coupled to the output terminal 703 via one or more other components.

It will be appreciated that the circuit under test 701 may be any signal processing component or chain of components, which may comprise linear circuits commonly used in RFICs, such as amplifiers, phase rotators, filters, attenuators, and couplers.

The measurement apparatus 700 further comprises a first phase splitter 712 configured to generate, a first phase signal, I1 at output 713, and a first quadrature signal, Q1 at output 714, wherein the first phase signal I1 is +45° phase shifted relative to the input to the phase splitter and the first quadrature signal Q1 is −45° phase shifted with respect to the input to the phase splitter. It will be readily appreciated that these two signals will be in quadrature with each other (i.e. there will be a 90° phase difference between them).

A second phase splitter 704 configured to generate a second phase signal, I2 at output 705, and a second quadrature signal, Q2 at output 706, wherein the second phase signal I2 is +45° phase shifted relative to the input to the second phase splitter 712 and the second quadrature signal Q2 is −45° phase shifted with respect to the input to the second phase splitter 712. It will be readily appreciated that these two signals will be in quadrature with each other (i.e. there will be a 90° phase difference between them).

It will be appreciated that the first and second phase splitters 704 and 712 may be any type of splitter which provides for obtaining two quadrature signal components from a signal provided to its input terminal. In one or more other examples the phase splitters 704, 712 may be configured to provide one output that is 90° phase shifted relative to the input signal and another that is not phase shifted at all. However, it is also possible, as has been described above, to shift both outputs of the phase splitter by ±45° with respect to the signal that is provided at that input to the phase splitter. In one or more examples, such a phase splitter may be based on a polyphase filter.

A first multiplexer 723 is coupled to the first terminal 702 and the second terminal 703 of the circuit under test and is configured to operate in two modes. In a first mode, the first multiplexer passes the first signal (i.e. input signal to the circuit under test) to the input of the first phase splitter 712 and in a second mode the first multiplexer passes the second signal (i.e. output signal from the circuit under test) to the input of the first phase splitter.

A second multiplexer 722 is coupled to the first terminal 702 and the second terminal 703 of the circuit under test and is configured to operate in two modes. In a first mode, the second multiplexer passes the second signal to the input of the second phase splitter 704 and in a second mode, the second multiplexer 722 passes the first signal to the input of the second phase splitter.

In one or more examples, the first and second multiplexers may be controlled to adopt their respective first and second modes based on a control signal. In one or more examples, the control signal may be common and cause the first and second multiplexers to adopt their respective first modes in one instance and their second modes in another instance. In other examples, the multiplexers may be operated independently and are not necessarily synchronised in their mode switching operations. The measurement apparatus may be configured such that the first and second multiplexers may be operated such that they are both in their respective first modes, both in their respective second modes, or may be in different modes to each other or can be configured to not pass through either of their input signals to their respective phase splitters. In one or more examples, a calculation unit may control the mode of the first multiplexer and the second multiplexer. In other examples, the multiplexers may automatically switch between their modes, such as periodically, such that the calculation described later can be performed.

The measurement apparatus 700 further comprises a double-quadrature mixer 715 configured to receive the first phase signal I1, the first quadrature signal Q1, the second phase signal I2 and the second quadrature signal Q2 from the first and second multiplexers. The double quadrature mixer also comprises an output 721 and provides pairs of signals similar to as described in relation to the example FIG. 5.

The double quadrature mixer 721 may be configured to provide the following signal pair:

$$I1 \cdot I2 + Q1 \cdot Q2; \text{ and} \quad (i)$$

$$I1 \cdot Q2 - I2 \cdot Q1. \quad (ii)$$

It will be appreciated that with the first multiplexer 723 in the first mode and the second multiplexer 722 in the first mode, I1 and Q1 are quadrature signals based on the input signal to the circuit under test and I2 and Q2 are quadrature signals based on the output signal from the circuit under test 701. Likewise it will be appreciated that with the first multiplexer 723 in the second mode and the second multiplexer 722 in the second mode, I1 and Q1 are quadrature signals based on the output signal from the circuit under test and I2 and Q2 are quadrature signals based on the input signal to the circuit under test 701.

A calculation unit is provided to receive the output of the double-quadrature mixer 721 (not shown in this example). The calculation unit is configured to determine one or both of:
 (a) The phase shift of the circuit under test based on two pairs of signals at the output of the double quadrature mixer 721. In particular, with the first multiplexer 723 being in the first mode and the second multiplexer 722 being in the first mode (i.e. in a first configuration) the signal pair M1 and M2 are determined. With the first multiplexer being in the second mode and the second multiplexer being in the second mode (i.e. in a second configuration) the signal pair M3 and M4 are determined. The phase may be determined using average values of measurements M1 to M4. It will be appreciated that this averaging may be done by the calculation unit itself, such as in the digital domain, or by any passive averaging component, such as an integrator, placed between the double quadrature mixer output and the calculation unit. In other examples, the calculation unit may sample the output of the double quadrature mixer 715 over a time period such that an average value is inherently taken. The phase may then be determined using the average values of each of the measurements M1 to M4 based on eq. 6 or eq. 7 outlined previously;
 (b) the gain of the circuit under test, comprising a ratio of the amplitude B of the signal at the output terminal 703 of the circuit under test and the amplitude A of the signal at the input terminal 702 of the circuit under test. The gain is determined based on measurements M5 and M6. Measurement M5 is determined when the first multiplexer 723 in the first mode and the second multiplexer 722 in the second mode (i.e. in a third configuration) and M6 is determined when the first multiplexer 723 is in the second mode and the second multiplexer 1022 in the first mode (i.e. in a fourth configuration). The gain may be determined using average values of measurements M5 and M6. It will be appreciated that this averaging can be done by the calculation unit 730 itself, such as in the digital domain, or by any passive averaging component, such as an integrator, placed between the double quadrature mixer output and the calculation unit. In other examples, the calculation unit may sample the output of the double quadrature mixer 715 over a time period such that an average value is inherently taken. The gain may be determined using the average values of each of the measurements M5 and M6 based on any of eq. 8 to eq. 10 outlined previously.

The calculation unit may comprise a microprocessor, a computer, an ASIC, a FPGA or another form of digital circuit for performing the required calculations.

The double quadrature mixer 715 may be embodied as the circuit of FIG. 6. It comprises two mixers 616 and 617. In one or more examples, the mixers may be realised as Gilbert multipliers, according to the principle of example FIG. 8. Furthermore, the double quadrature mixer 715 may also contains a summing circuit 620 for summing the two output signals of mixers 616 and 617. The double quadrature mixer 715 also comprises a further two multiplexers 618 and 619. These additional multiplexers control the input signals to mixers 616 and 617 and can operate in two configurations:
 In one configuration, signals I1 provided at output 713 and I2 provided at output 705 are connected to mixer 616. Further signals Q1 provided at output 714 and Q2 provided at output 706 are connected to multiplier 617 to generate measurements M1 or M3 depending on the configuration of the first and second multiplexers 722, 723 feeding the input of the first and second phase splitters 704, 712.
 In an alternative configuration, signals I1 provided at output 713 and Q2 provided at output 706 are connected to mixer 616. Further, signals Q1 provided at output 1014 and minus signal I2 provided at output 705 are connected to mixer 617 to generate measurement M2 or M4 depending on the configuration of the first and second multiplexer feeding the input of the first and second phase splitters 704, 712.

Thus, in one or more examples, to determine the phase shift of the circuit under test, the calculation unit is configured to determine, based on the pair of signals at said output 721 with said first multiplexer in the first mode and the second multiplexer in the first mode, the following:
 a first average value (M1) of I1·I2+Q1·Q2; and
 a second average value (M2) of I1·Q2−I2·Q1; and
 the calculation unit is configured to determine, based on the pair of signals at said output 721 with said first multiplexer in the second mode and the second multiplexer in the second mode, the following:
 a third average value (M3) of I1·I2+Q1·Q2;
 a fourth average value (M4) of I1·Q2−I2·Q1.

The phase φ may then be measured with the following calculation:

$$\frac{1}{2}\left\{ a\tan\left(\frac{M2}{M1}\right) - a\tan\left(\frac{M4}{M3}\right)\right\} = \quad \text{eq. 6}$$

-continued $$\frac{1}{2}\left\{a\tan\left(\frac{A.B\cos(\varphi - 90°) - A.B.\cos(\varphi + 90°)}{A.B.\cos(\varphi) + A.B.\cos(\varphi)}\right) - a\tan\left(\frac{A.B\cos(-\varphi - 90°) - A.B.\cos(-\varphi + 90°)}{A.B.\cos(\varphi) + A.B.\cos(\varphi)}\right)\right\} = \varphi.$$

But consider now again that the signal Q2 at output 706 suffers from a phase error Δφ. This means:

In the first configuration:
phase of I1=45° with respect to the phase of the input signal.
phase of Q1=−45° with respect to the phase of the input signal.
phase of I2=φ+45° with respect to the phase of the input signal.
phase of Q2=φ−45°+Δφ with respect to the phase of the input signal.

In the second configuration:
phase of I1=φ+45° with respect to the phase of the input signal.
phase of Q1=φ−45° with respect to the phase of the input signal.
phase of I2=45° with respect to the phase of the input signal.
phase of Q2=−45°+Δφ with respect to the phase of the input signal.

Measuring the phase φ according to eq. 6 then yields:

$$\frac{1}{2}\left\{a\tan\left(\frac{M2}{M1}\right) - a\tan\left(\frac{M4}{M3}\right)\right\} =$$

$$\frac{1}{2}\left\{a\tan\left(\frac{A.B\cos(\varphi - 90° + \Delta\varphi) - A.B.\cos(\varphi + 90°)}{A.B.\cos(\varphi) + A.B.\cos(\varphi + \Delta\varphi)}\right) - a\tan\left(\frac{A.B\cos(-\varphi - 90° + \Delta\varphi) - A.B.\cos(-\varphi + 90°)}{A.B.\cos(\varphi) + A.B.\cos(\varphi - \Delta\varphi)}\right)\right\} \approx$$

$$\frac{1}{2}\left\{\left(\varphi + \frac{\Delta\varphi}{2}\right) - \left(-\varphi + \frac{\Delta\varphi}{2}\right)\right\} = \varphi.$$

Thanks to the signal swapping by the action of the first and second multiplexers 722, 723, the measurement errors resulting from a phase error on Q2, are cancelled out. In a first order, the calculated result, as calculated by eq. 6, is not influenced by Δφ. Similar calculations show that phase errors on signals I1, I2 or Q1 are also cancelled out in a first order.

e) It may be possible that a mixer might introduce different phases in the signal paths from its inputs to its output.

Figure 8:
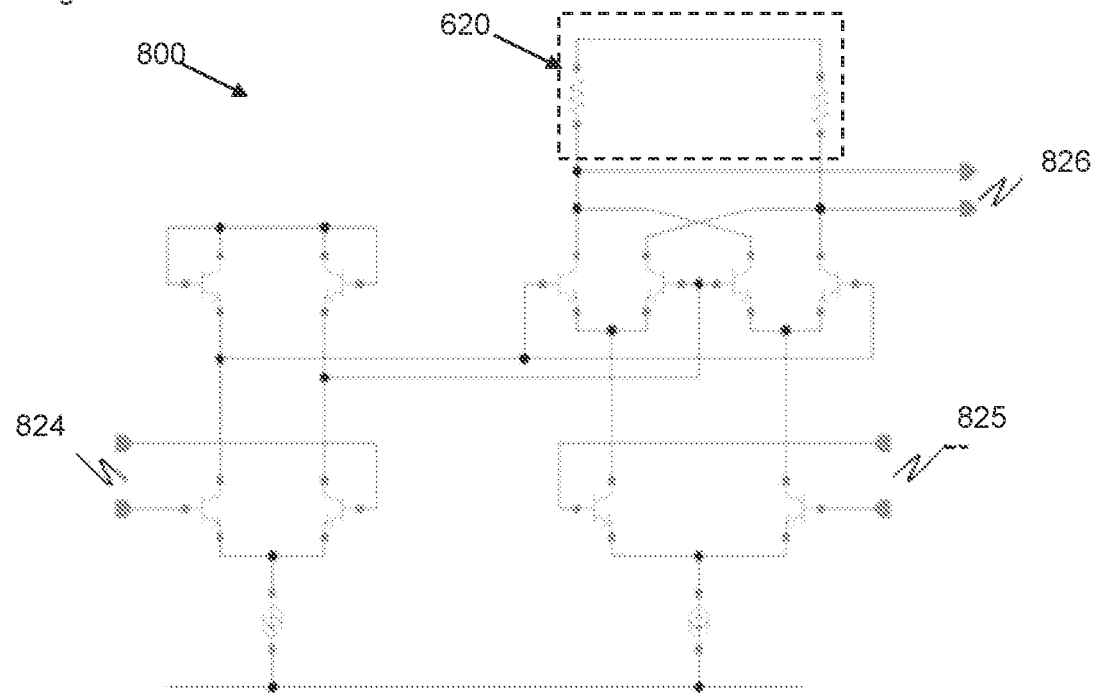
FIG. 8 shows an example configuration of a double quadrature mixer embodied as a Gilbert multiplier.

A mixer as shown in FIG. 1 as mixers 107 or 108 or in FIG. 2 as mixer 207 or in FIG. 6 as mixers 616 or 617 (i.e. part of double quadrature mixer 715) might be constructed according to a principle, known in the art as a "Gilbert multiplier". Such a Gilbert multiplier 800 is shown in FIG. 8.

In general, the signal path from one mixer input terminal 824 to the mixer output terminal 826 is fundamentally different from the signal path from the other mixer input terminal 825 to the output terminal 826. As a result, the phases introduced by the mixer in these two signal paths are not equal. This phase difference may be poorly controlled during fabrication. The phase error may add to the final calculated result.

Figure 9:
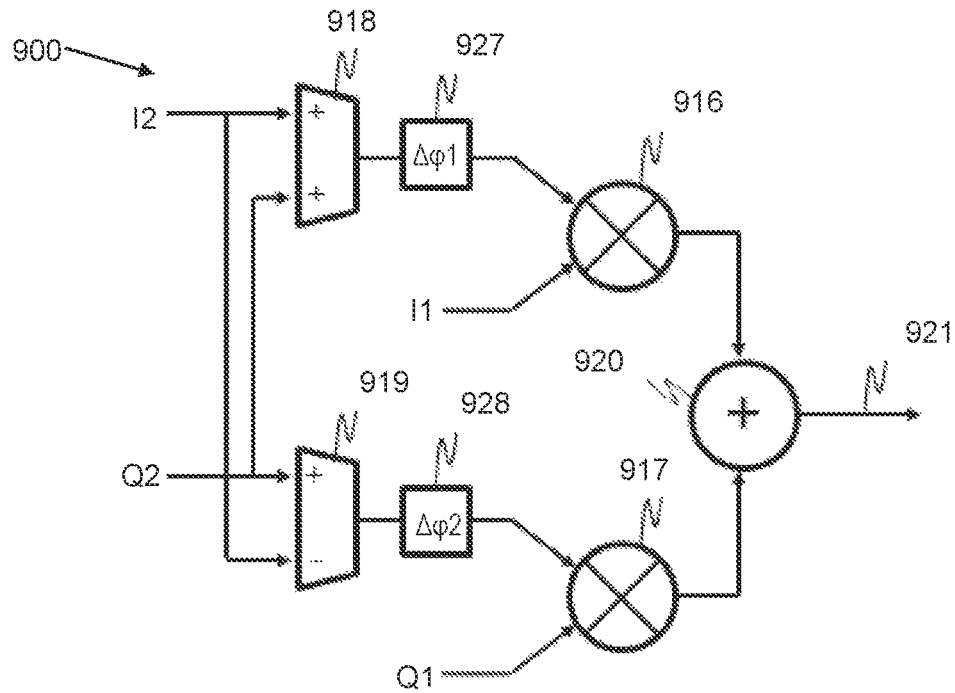
FIG. 9 illustrates the effect of additional phase delays introduced by mixer components in the double quadrature mixer.

The influence of this phase difference can be analysed with the equivalent circuit of FIG. 9. This figure is identical to FIG. 6, and the phase errors are shown, for understanding, as phase changing components to add two additional phase errors Δφ1 by block 927 and Δφ2 by block 928. These phase errors are in practice, as will be appreciated, introduced by mixers 916 and 917, respectively, in one of their signal paths.

The phase φ is still measured with the measurement apparatus 700 of FIG. 7, whereby the Double-Quadrature mixer 715 is embodied as the circuit 900 of FIG. 9. The phase φ is still calculated by eq. 6, but the error phases Δφ1 and Δφ2 need to be considered such that:

$M1$=average($I1·I2+Q1·Q2$), in the first configuration=$A·B·\cos(\varphi+\Delta\varphi1)+A·B·\cos(\varphi\Delta\varphi2)$, $M2$=average($I1·Q2−I2·Q1$), in the first configuration=$A·B·\cos(\varphi−90°+\Delta\varphi1)−A·B·\cos(\varphi+90°+\Delta\varphi2)$, $M3$=average($I1·I2+Q1·Q2$), in the second configuration=$A·B·\cos(\varphi−\Delta\varphi1)+A·B·\cos(\varphi−\Delta\varphi2)$, $M4$=average($I1·Q2−I2·Q1$), in the second configuration=$A·B·\cos(\varphi+90°−\Delta\varphi1)−A·B·\cos(\varphi−90°−\Delta\varphi2)$.

Eq. 6 then gives:

$$\frac{1}{2}\left\{a\tan\left(\frac{M2}{M1}\right) - a\tan\left(\frac{M3}{M4}\right)\right\} =$$

$$\frac{1}{2}\left\{a\tan\left(\frac{A.B\cos(\varphi - 90° + \Delta\varphi_1) - A.B.\cos(\varphi + 90° + \Delta\varphi_2)}{A.B.\cos(\varphi + \Delta\varphi_1) + A.B.\cos(\varphi + \Delta\varphi_2)}\right) - a\tan\left(\frac{A.B\cos(-\varphi - 90° + \Delta\varphi_1) - A.B.\cos(-\varphi + 90° - \Delta\varphi_2)}{A.B.\cos(\varphi - \Delta\varphi_1) + A.B.\cos(\varphi - \Delta\varphi_2)}\right)\right\} \approx$$

$$\frac{1}{2}\left\{\left(\varphi + \frac{\Delta\varphi_1 + \Delta\varphi_2}{2}\right) - \left(-\varphi + \frac{\Delta\varphi_1 + \Delta\varphi_2}{2}\right)\right\} = \varphi.$$

In conclusion, without the signal swapping provided by the multiplexers 722, 723, a non-zero phase imbalance Δφ1 and/or Δφ2 might cause an error on final calculated result approximately equal to 50% of (Δφ1+Δφ2).

Thanks to the input signal swapping by multiplexers 722 and 723, the phase errors Δφ1 927 and Δφ2 928 cause no error in the final calculated result.

The phase calculation thus uses four measurements: M1, M2, M3 and M4. It will be appreciated that the measurement M1, M2, M3, M4 may be taken time consecutively directly one after another. Alternatively, the determination of M1, M2, M3, M4 may be taken at time spaced intervals.

In a further embodiment of the disclosure the presence of DC offset voltages may be accounted for.

f) It is possible that circuits in the embodiment of FIG. 7 can produce DC offset voltages that contribute to measurement errors.

In one or more examples, due to component inaccuracies, the DC voltages on all circuit nodes in the circuit of FIG. 7 might suffer from production tolerances. These might influence the results of the four measurements M1 to M4, described above. Hence, they might influence the result, calculated by eq. (6).

When the signals at input terminal 702 of the circuit under test and the output terminal 703 of the circuit under test are AC signals, meaning that the signal information is not represented by the DC-component of the signal, then AC-coupling can be applied to all signal paths from the input terminal 702 of the circuit under test and output terminal 703 of the circuit under test to the inputs, I1, Q1, I2, Q2 of the double quadrature mixer 715. In this way, DC-offset voltages produced in these signal paths are cancelled out.

Thus, in one or more examples an AC coupler is provided at one or more of the input of the first multiplexer, the input of the second multiplexer, the input of the first phase splitter, the input of the second phase splitter, an output of the first phase splitter and an output of the second phase splitter to pass only the AC signal to the subsequent component.

Nevertheless, the mixers 916 and 917 of the double quadrature mixer 715 themselves perform a frequency translation. The useful information of each of the four measurements M1 to M4 may therefore be contained in the average of the output signal at the output terminal of the double quadrature mixer 921, hence in the DC-component. It is not possible to place AC-coupling in the signal paths at the output 621 or 921 of the double quadrature mixer 715 or 900. Any offset voltages generated by the mixers 916 or 917, or by the summing circuit 920, add to the measurement results M1 to M4 and may therefore influence the result calculated by eq. 6.

In order to compensate for DC-offset voltages, a fifth measurement termed here a reference average value and designated the symbol "M0" may be performed, whereby the amplitudes of input signal at the input terminal 702 of the circuit under test and output signal at the output terminal 703 of the circuit under test are set to zero. Alternatively, the fifth measurement is performed with multiplexers 722 and 723 configured in such a way that none of the signals at input terminal 702 of the circuit under test and output terminal 703 of the circuit under test is routed to the outputs of multiplexers 722 or 723. This can be considered as a fifth configuration of the measurement apparatus or multiplexers 722 and 723. The measurements M1 to M4 can then be corrected by using this reference average value measurement M0.

Thus, the measurement apparatus 700 may be configured to determine a reference average value (M0), based on the output of the double quadrature mixer 715, in which the measurement apparatus is configured such that one of: the inputs to the double-quadrature mixer are disconnected from the first and second phase splitter or the first signal and the second signal are set to zero.

This means that eq. 6 becomes:

$$\text{measured phase} = \frac{1}{2}\left\{a\tan\left(\frac{M2-M0}{M1-M0}\right) - a\tan\left(\frac{M4-M0}{M3-M0}\right)\right\}. \quad \text{eq. 7}$$

As described above, the measurement apparatus 700 may alternatively, or in addition, be configured to the measure the gain of the circuit under test. The calculation unit (not shown in FIG. 7) may be configured as follows.

In the third configuration, the first and second multiplexers 722 and 723 are configured such that the first signal, which in this example comprises the input signal at the input terminal 702 of the circuit under test 701 is passed to the phase splitters by both the first and second multiplexers 722 and 723. The double quadrature mixer 715 provides at its output 721 one of the pair of signals, which comprises I1·I2+Q1·Q2. An average value of this may be determined in any of the ways described above. Thus, in this third configuration, a measurement "M5" can be performed, where:

$$M5 = \text{average } (I1.I2 + Q1.Q2), \text{ in the third configuration } =$$
$$A.A\cos((45°)-(45°)) + A.A\cos((-45°)-(-45°)) = 2.A.A.$$

In the fourth configuration, the first and second multiplexers 722 and 723 are configured such that the second signal, which in this example comprises the output signal at the output terminal 703 of the circuit under test 701 is passed to the phase splitters by both the first and second multiplexers. The double quadrature mixer 715 provides at its output 721 one of the pair of signals, which comprises I1·I2+Q1*Q2. An average value of this may be determined in any of the ways described above. Thus, in this fourth configuration, a measurement "M6" can be performed:

$$M6 = \text{average } (I1.I2 + Q1.Q2), \text{ in the fourth configuration } =$$
$$B.B\cos((\varphi+45°)-(\varphi+45°)) + B.B\cos((\varphi-45°)-(\varphi-45°)) = 2.B.B.$$

Thus, to summarise, the measurement apparatus 700 is configured to determine a fifth average value (M5) comprising one of said pair of signals provided at said output of the double-quadrature mixer, wherein the first multiplexer is in the first mode and the second multiplexer is in the second mode, comprising I1·I2+Q1·Q2; and measurement apparatus 700 is configured to determine a sixth average value (M6) comprising one of said pair of signals provided at said output of the double-quadrature mixer, wherein the first multiplexer is in the second mode and the second multiplexer is in the first mode, comprising I1·I2+Q1·Q2.

Then, the signal gain, which is equal to the ratio B/A, can be calculated as:

$$\text{measuredgain} = \frac{B}{A} = \sqrt{\frac{M6}{M5}}. \quad \text{eq. 8}$$

It will be appreciated that given only one of the pairs of signals output by the double quadrature mixer 715 is required to determine the gain, in one or more examples in which only the gain is determined (i.e. not the phase shift), the double quadrature mixer 715 may be embodied as a first mixer to determine I1·I2 and a second mixer to determine Q1·Q2 and a summing element to determine, based on the output of the first and second mixers, I1·I2+Q1·Q2.

As described above, it is possible that circuits in the embodiment of FIG. 7 can produce DC offset voltages that contribute to measurement errors. Thus, M0 may be used to remove any DC offset values and is determined by placing the multiplexers 722 and 723 in to the fifth configuration as outlined previously. Thus, in one or more examples, in order to compensate for DC offset voltages, the following calculation is used to determine the gain:

$$\text{measuredgain} = \frac{B}{A} = \sqrt{\frac{M6-M0}{M5-M0}}. \quad \text{eq. 9}$$

Hence, the circuit of FIG. 7 allows measuring the signal gain of the circuit under test 701.

In an alternative embodiment, the gain can also be calculated as:

$$measuredgain = \frac{B}{A} = \frac{M6 - M0}{\sqrt{(M1-M0)^2 + (M2-M0)^2}}. \quad \text{eq. 10}$$

In one or more examples, the calculation using equation 10 may be performed efficiently. Indeed, from the definitions of M0, M1, M2 and M6 described above, one can verify that this corresponds to:

$$measuredgain = \frac{B}{A} = \frac{2.B.B}{\sqrt{(2.A.B\cos(\varphi))^2 + 2.A.B\sin(\varphi)^2}}.$$

Now, the ratio between M1 and M6 or M2 and M6 is increasing only with the ratio $$\left(\frac{B}{A}\right)$$

and not by $$\left(\frac{B}{A}\right)^2,$$

which may be easier to determine.

The measurement apparatus 700 may also be configured for estimating the signal power of signals at the input terminal 702 of the circuit under test and output terminal 703 of the circuit under test.

As stated above, calculation M5–M0 is proportional to A.A, i.e. proportional to the signal power on the signal at the input terminal 702 of the circuit under test 701. The absolute value of M5–M0 depends also on the gain of the measurement apparatus 700 between input terminal 702 and the output terminal of the double quadrature mixer 721. This means that it depends on the mixer conversion gain, the insertion gains of the multiplexers 722 and 723, and of gains of the phase splitters 704 and 712. Also, phase errors in phase splitters 704 and 712 have an influence on the measurement result M5–M0. All these errors may be compensated for by performing a one-time calibration, if required. During such calibration, a well-known signal may be applied to the input terminal of 702 of the circuit under test 702, and the resulting measurement result equivalent to measurement M5 is captured and stored as a calibration function (fc). This calibration function information can be used later on to compensate for these errors while using the result M5–M0 for estimating the signal power at the input terminal 702. The calibration function may comprise a value the is added or subtracted from the result e.g. M5–M0+fc. In other examples, the calibration function comprises a function of the result i.e. fc(M5–M0).

Similarly, the signal power at the output terminal 703 of the circuit under test 701 can be estimated by using measurement result M6–M0. Here also, a calibration for determining the gain of the measurement chain between output terminal 703 of the circuit under test 701 and the output terminal of the double quadrature mixer 721 can be determined, this allows for compensating for all gain or phase errors in the measurement apparatus 700.

To summarise, in the determination of the phase shift and/or gain, the measurement apparatus 700 may adopt various configurations wherein the first multiplexer 723 and the second multiplexer 722 may be configured in different mode combinations. The various configurations described above to yield one or more of the phase shift, gain, input signal power and output signal power are summarised in Table 1.

TABLE 1

| Configuration | First multiplexer | Second multiplexer | Measurements |
| --- | --- | --- | --- |
| 1 | First mode | First mode | M1, M2 |
| 2 | Second mode | Second mode | M3, M4 |
| 3 | First mode | Second mode | M5 |
| 4 | Second mode | First mode | M6 |
| 5 | No throughput | No throughput | M0 (reference average value) |
| 6 | Well known (a) | Well known (a) | Fc (input branch) |
| 7 | Well known (b) | Well known (b) | Fc (output branch) |

Figure 10:
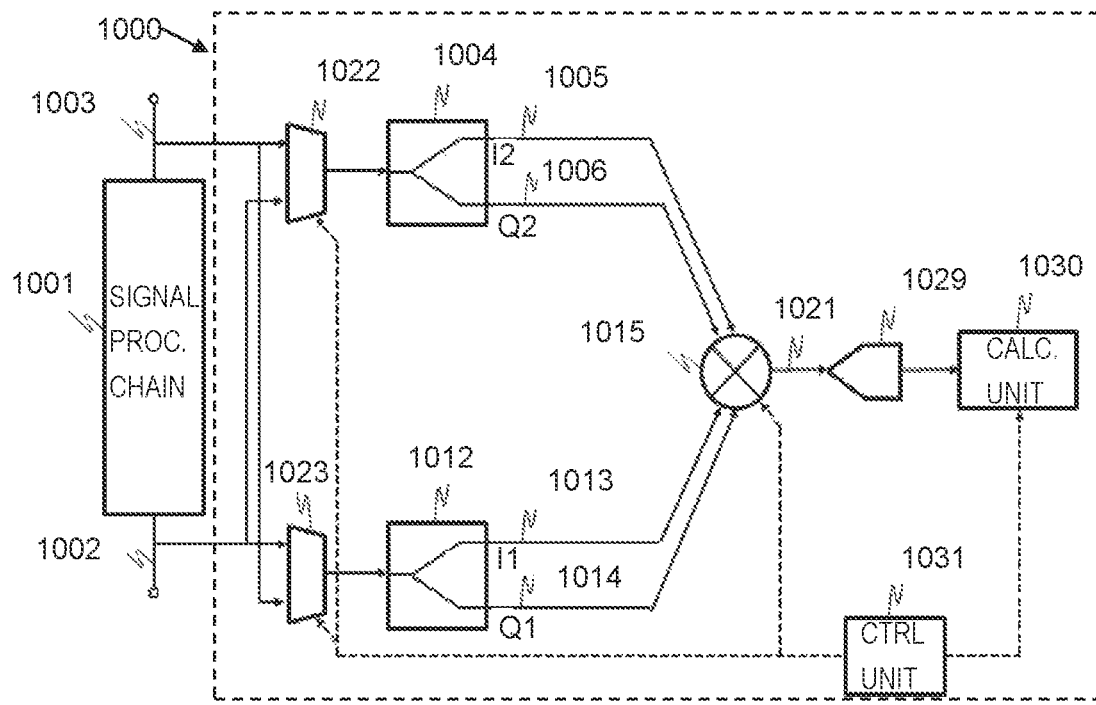
FIG. 10 shows a further example embodiment of the measurement apparatus and shows an example controller for controlling multiplexers of the measurement apparatus.

Example FIG. 10 shows an embodiment of the measurement apparatus 1000. The measurement apparatus 1000 is substantially identical to the measurement apparatus 700 of FIG. 7. However, in the example of FIG. 10, the calculation unit 1030 is shown in combination with an Analog-to-Digital Converter 1029 that converts the pairs of signals output by the double quadrature mixer 1021 into a digital format. Thus, in this example, the calculation unit may be configured to determine the averages of M1 to M6 and M0 as appropriate. The calculation unit 1030 is configured to perform the calculations according to equations eq.7, eq.9 and/or eq.10, as described above. The embodiment of FIG. 10 further comprises a control unit 1031. The control unit 1031 controls the first and second multiplexers 1022, 1023 and those of the double quadrature mixer 618, 619. The control unit may be configured to control the multiplexers to allow for the performing of the required measurements (those required from M0 to M6) one after the other, either sequentially or at spaced intervals. It may also be configured to control the calculation unit 1030, to perform all calculations at the right time based on the of the current signal output by the double quadrature mixer 1015.

In one or more examples, the calculation unit 1030 may not perform the averaging. The averaging may be achieved by using an ADC 1029 with a low cut-off frequency. Thus, a single sample of the output of such an ADC 1029 may provide the average value.

As a practical example, the operating frequencies of the circuit under test 1001 can be at the 5G frequency bands comprising frequencies around the 28 GHz band. The cut-off frequency of the ADC may, in such an example, be set to 1 MHz. It will be appreciated that the cut-off frequency of the ADC may be lower that the operating frequency of the circuit under test to provide the averaging. In the above example, the ADC cut-off frequency is approximately four orders of magnitude smaller than the operating frequency of the circuit under test which operates at the 5G frequency bands. In other examples, the cut-off frequency of the ADC may be up to a tenth, or up to one hundredth, or up to a thousandth of the operating frequency of the circuit under test. However, as long as the cut-off frequency of the ADC is lower than the frequency of the circuit under test, a single sample taken by the ADC will experience multiple cycles of the circuit under test and so will inherently output an average value.

Figure 11:
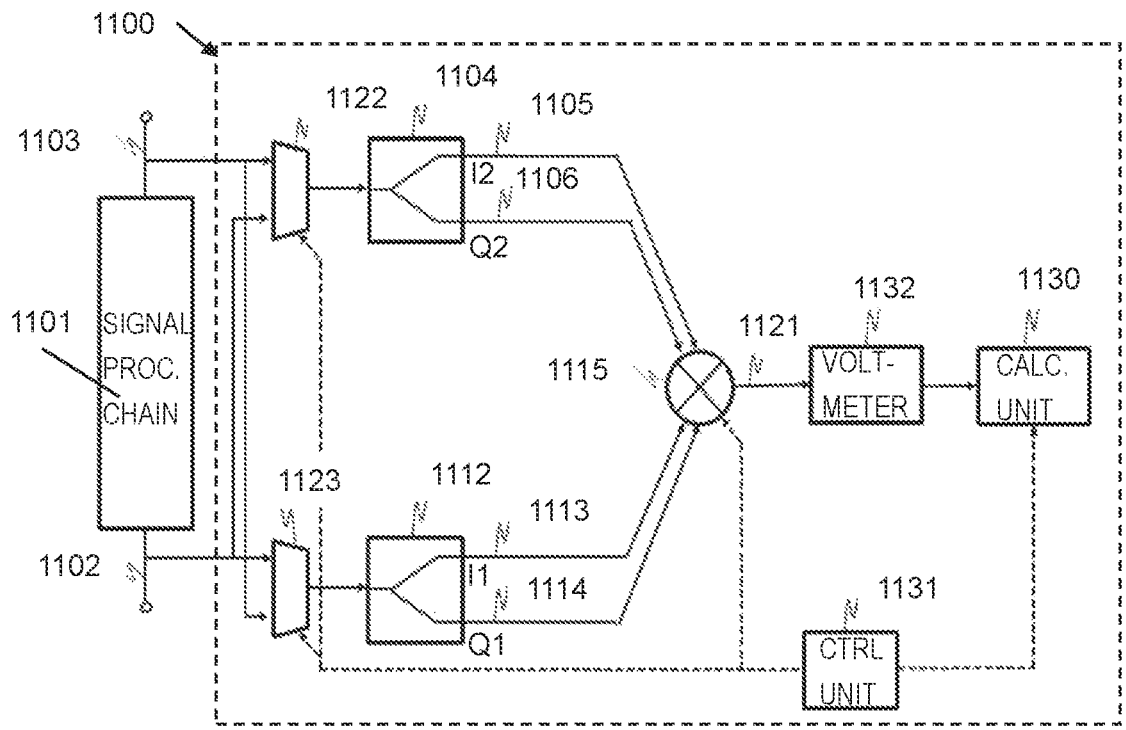
FIG. 11 shows a further example embodiment of the measurement apparatus.

Another example embodiment is shown in FIG. 11. Here, the double quadrature mixer output signal 1121 is received by a voltmeter 1132. The calculation unit 1130 may be configured to determine the phase shift and/or gain as outlined above.

In other examples, the calculation unit 1030, 1130 may be configured to provide the average values for determination of the phase shift and/or gain by a different entity.

Thus, to summarise FIGS. 10 and 11, the measurement apparatus 700, 1000, 1100, may comprise, for determining the phase shift of the circuit under test, a calculation unit that includes an analog-to-digital converter 1029 to convert the output of the double quadrature mixer to a digital signal for processing by the calculation unit.

Further, the measurement apparatus 700, 1000, 1100, may comprise, for determining the gain of the circuit under test, a calculation unit that includes a voltmeter 1132 to determine the voltage at the output of the double quadrature mixer for processing by the calculation unit 1130.

In the case of FIG. 11, there may be a separate averaging component that is used as discussed above, or alternatively the calculation unit 1130 may be configured to determine the average values from output of the voltmeter.

In one or more embodiments, the measurement apparatus 700, 1000, 1100 may be switchable between the examples of FIGS. 10 and 11. Thus, the calculation unit 1030 may include a switch to switch between the ADC 1029 and the voltmeter 1132, which are both coupled to the output of the double quadrature mixer 715, 1015, 1115.

In one or more examples, the measurement apparatus 700, 1000, 1100 may be formed on the same integrated circuit as the circuit under test. In one or more embodiments, at least the first and second phase splitters 704, 1004, 1104, 712 1012, 1112 are formed on same integrated circuit.

Figure 12:
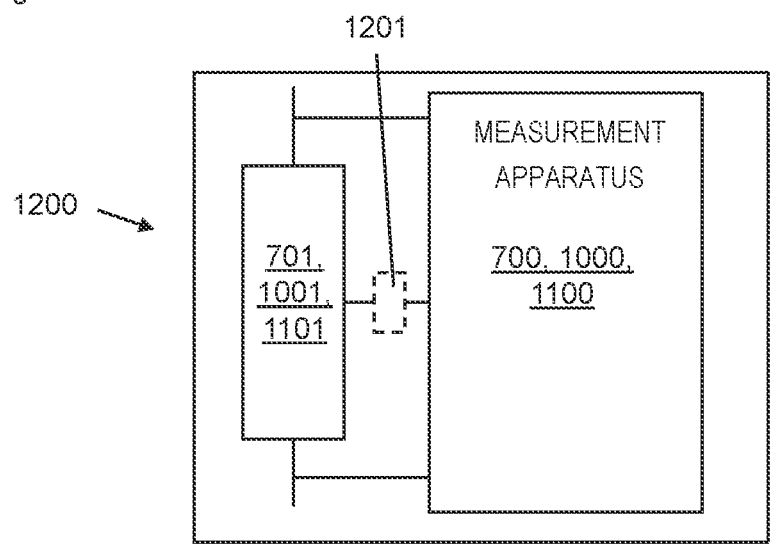
FIG. 12 shows an electronic device including the measurement circuit, wherein the electronic device may comprise a 5G New Radio transceiver.

In one or more embodiments, the measurement apparatus comprises a built-in self-test circuit. FIG. 12 shows an arrangement 1200 in which the measurement apparatus 700, 1000, 1100 is on the same integrated circuit as the circuit under test 701, 1001, 1101. The measurement apparatus 700, 1000, 1100 may be considered a BIST circuit.

In one or more examples, the phase shift of the circuit under test that is determined by the measurement apparatus is provided to a calibration unit 1201 that may be configured to calibrate the circuit under test based on said phase shift. Accordingly, where the circuit under test is required to provide a desired phase shift, the measurement apparatus may be configured to measure the phase shift and provide feedback to the calibration unit which may be configured to adjust the circuit under test to achieve the desired phase shift.

In one or more examples, the gain of the circuit under test that is determined by the measurement apparatus is provided to a calibration unit 1201 configured to calibrate the circuit under test based on said gain. Accordingly, where the circuit under test is required to provide a desired gain, the measurement apparatus may be configured to measure the gain and provide feedback to the calibration unit which may be configured to adjust the circuit under test to achieve the desired gain.

The arrangement 1200 may comprise an electronic device comprising a 5G New Radio transceiver, wherein the circuit under test 701, 1001, 1101 comprises part of one of a transmission path or a receive path of said transceiver and the measurement apparatus 700, 1000, 1100 is configured to determined one or both of the phase shift and gain of said transmission/receive path.

In one or more examples, the measurement apparatus is configured to track circuit aging whereby the tracking of the gain and/or phase shift of the circuit under test can be measured during the circuit lifetime to determine effects related to aging of the circuit.

In one or more examples, the measurement apparatus is configured to Measure gain and/or phase of the circuit under test and can be used as a self-test. In one or more examples, when the phase shift and/or gain measurements fall outside a predefined range, the circuit under test can be considered as defective. This offers a possibility of low-cost production testing, or for auto-generated warnings during operation.

Implementation of the self-calibration and self-testing of large volumes of RFICs can allow for significant cost reductions especially for low unit-cost components such as for wireless communication system RFICs.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A measurement apparatus comprising:
   a first terminal for coupling to a circuit under test to receive a first signal corresponding to an input to the circuit under test;
   a second terminal for coupling to the circuit under test to receive a second signal corresponding to an output from the circuit under test;
   a first phase splitter configured to generate, based on the signal provided at an input of the first phase splitter, a first phase signal, I1, and a first quadrature signal, Q1, the first quadrature signal in quadrature with the first phase signal;
   a second phase splitter configured to generate, based on the signal provided at an input of the second phase splitter, a second phase signal, I2, and a second quadrature signal, Q2, the second quadrature signal in quadrature with the second phase signal;
   a first multiplexer coupled to the first terminal and the second terminal and configured, in a first mode of the first multiplexer, to pass the first signal to the input of the first phase splitter and, in a second mode of the first multiplexer, to pass the second signal to the input of the first phase splitter;
   a second multiplexer coupled to the first terminal and the second terminal and configured, in a first mode of the second multiplexer, to pass the second signal to the input of the second phase splitter and, in a second mode of the second multiplexer, to pass the first signal to the input of the second phase splitter; and
   a double-quadrature mixer having four inputs configured to receive the first phase signal, I1, the first quadrature signal, Q1, the second phase signal, I2, and the second quadrature signal, Q2, and having an output.

2. The measurement apparatus of claim 1, further comprising:
   a calculation unit configured to receive the output of the double-quadrature mixer, the output comprising a pair of signals, and configured to determine one or both of:
   a) a phase shift of the circuit under test based on the pair of signals at the output of the double-quadrature mixer, with the first multiplexer in the first mode and the second multiplexer in the first mode, and the pair of signals at the output with the first multiplexer in the second mode and the second multiplexer in the second mode; or
   b) a gain of the circuit under test, comprising a ratio of the amplitude, B, of the second signal and the amplitude, A, of the first signal, based on the pair of signals at the output of the double-quadrature mixer, with the first multiplexer in the first mode and the second multiplexer in the second mode, and the pair of signals at the output of the double-quadrature mixer, with the first multiplexer in the second mode and the second multiplexer in the first mode.

3. The measurement apparatus of claim 2 wherein, to determine the phase shift of the circuit under test, the calculation unit is configured to determine, based on the pair of signals at the output with the first multiplexer in the first mode and the second multiplexer in the first mode, the following:
   a first average value, M1, of I1·I2+Q1·Q2; and
   a second average value, M2, of I1·Q2−I2·Q1; and
   the calculation unit is configured to determine, based on the pair of signals at the output with the first multiplexer in the second mode and the second multiplexer in the second mode, the following:
   a third average value, M3, of I1·I2+Q1·Q2; and
   a fourth average value, M4, of I1·Q2−I2·Q1;
   wherein the phase shift of the circuit under test is given by:

$$\frac{1}{2}\left\{ atan\left(\frac{M2}{M1}\right) - atan\left(\frac{M4}{M3}\right)\right\}.$$

4. The measurement apparatus of claim 3 wherein, to determine the phase shift of the circuit under test, the calculation unit is configured to determine the following:
   a reference average value, M0, based on the output of the double-quadrature mixer, in which the measurement apparatus is configured such that one of: the inputs to the double-quadrature mixer are disconnected from the first and second phase splitter or the first signal and the second signal are set to zero; and
   wherein the phase shift of the circuit under test comprises:

$$\frac{1}{2}\left\{ atan\left(\frac{M2 - M0}{M1 - M0}\right) - atan\left(\frac{M4 - M0}{M3 - M0}\right)\right\}.$$

5. The measurement apparatus of claim 2 wherein the calculation unit is configured to determine the following average values to determine the gain of the circuit under test:
   a fifth average value, M5, of one of the pair of signals provided at the output of the double-quadrature mixer, wherein the first multiplexer is in the first mode and the second multiplexer is in the second mode, comprising I1·I2+Q1·Q2; and
   a sixth average value, M6, of one of the pair of signals provided at the output of the double-quadrature mixer, wherein the first multiplexer is in the second mode and the second multiplexer is in the first mode, comprising I1·I2+Q1·Q2; and
   wherein the gain comprises:

$$\text{Gain} = \frac{B}{A} = \sqrt{\frac{M6}{M5}}.$$

6. The measurement apparatus of claim 5 wherein the calculation unit is configured to determine the gain of the circuit under test by determining a further average value comprising:
   a reference average value, M0, based on the output of the double-quadrature mixer, in which the measurement apparatus is configured such that one of: the inputs to the double-quadrature mixer are disconnected from the first and second phase splitter or the first signal and the second signal are set to zero; and wherein the gain comprises:

$$\text{Gain} = \frac{B}{A} = \sqrt{\frac{M6 - M0}{M5 - M0}}.$$

7. The measurement apparatus of claim 5 wherein the calculation unit is configured to determine the gain of the circuit under test by determining a further average value comprising:
   a reference average value, M0, based on the output of the double-quadrature mixer, in which the measurement apparatus is configured such that one of: the inputs to the double-quadrature mixer are disconnected from the first and second phase splitter or the first signal and the second signal are set to zero; and
   wherein the gain comprises:

$$\text{Gain} = \frac{B}{A} = \frac{M6 - M0}{\sqrt{(M1 - M0)^2 + (M2 - M0)^2}}.$$

8. The measurement apparatus of claim 2 wherein the calculation unit is configured to determine the following average values to determine the signal power of the first signal provided to the circuit under test:
   a fifth average value, M5, of one of the pair of signals provided at the output of the double-quadrature mixer, wherein the first multiplexer is in the first mode and the second multiplexer is in the second mode, comprising I1·I2+Q1·Q2; and
   a reference average value, M0, based on the output of the double-quadrature mixer, in which the apparatus is configured such that one of: the inputs to the double-quadrature mixer are disconnected from the first and second phase splitter or the first signal and the second signal are set to zero; and
   wherein the signal power of the first signal comprises:

$$f_C(M5-M0);$$

where $f_C$ comprises a function based on predetermined calibration data that accounts for additional signal power introduced by the measurement apparatus.

9. The measurement apparatus of claim 8 wherein the calibration data is determined based on the measurement apparatus having been provided with a signal of known signal power at both the first multiplexer and the second multiplexer and wherein the calibration data is determined based on one or both of:
   a value, M5, of one of the pair of signals provided at the output of the double-quadrature mixer, wherein the first multiplexer is in the first mode and the second multiplexer is in the second mode, comprising I1·I2+Q1·Q2; or
   a value, M6, of one of the pair of signals provided at the output of the double-quadrature mixer, wherein the first multiplexer is in the second mode and the second multiplexer is in the first mode, comprising I1·I2+Q1·Q2.

10. The measurement apparatus of claim 2 wherein the calculation unit is configured to determine the following average values to determine the signal power of the second signal provided to the circuit under test:
   a sixth average value, M6, of the output wherein the first multiplexer is in the second mode and the second multiplexer is in the first mode, comprising I1·I2+Q1·Q2; and
   a reference average value, M0, in which the apparatus is configured such that one of: the inputs to the double-quadrature mixer are disconnected from the first and second phase splitter or the first signal and the second signal are set to zero; and
   wherein the signal power of the first signal comprises:

$$f_C(M6-M0);$$

where $f_C$ comprises a function based on predetermined calibration data that accounts for additional signal power introduced by the measurement apparatus.

11. The measurement apparatus of claim 2, wherein one or both of:
   for determining the phase shift of the circuit under test, the calculation unit includes an analog-to-digital converter to convert the output of the double-quadrature mixer to a digital signal for processing by the calculation unit; or
   for determining the gain of the circuit under test, the calculation unit includes a voltmeter to determine the voltage at the output of the double-quadrature mixer for processing by the calculation unit.

12. The measurement apparatus of claim 1, wherein an AC coupler is provided at one or more of the input of the first multiplexer, the input of the second multiplexer, the input of the first phase splitter, the input of the second phase splitter, an output of the first phase splitter and an output of the second phase splitter.

13. The measurement apparatus of claim 1, wherein the double-quadrature mixer comprises:
   a first mixer configured to receive I1 from the first phase splitter and an output of a third multiplexer; and
   a second mixer configured to receive Q1 from the first phase splitter and an output of a fourth multiplexer;
      wherein the output of the first mixer and the output of second mixer are coupled with a summing element configured to determine a sum of the outputs of the first and second mixers and provide it to the output of the double-quadrature mixer;
      wherein the third multiplexer is configured, in a first mode, to select I2 and, in a second mode, to select Q2 to provide to the first mixer; and
      wherein the fourth multiplexer is configured, in a first mode, to select Q2 and, in a second mode, to select −I2 to provide to the second mixer.

14. The measurement apparatus of claim 13, wherein the first mixer and the second mixer of the double-quadrature mixer comprise respective Gilbert multipliers.

15. The measurement apparatus of claim 1, wherein the first phase splitter and/or the second phase splitter are based on a polyphase filter.

16. A method comprising:
   in a first mode, with a first multiplexer, selectively passing a first signal to a first phase splitter, the first signal corresponding to an input to a circuit under test;
   in the first mode, with a second multiplexer, selectively passing a second signal to a second phase splitter, the second signal corresponding to an output from the circuit under test;
   in a second mode, with the first multiplexer, selectively passing the second signal to the first phase splitter;

in the second mode, with the second multiplexer, selectively passing the first signal to the second phase splitter;

with the first phase splitter, generating a first phase signal, I1, and a first quadrature signal, Q1, wherein the first quadrature signal is in quadrature with the first phase signal;

with the second phase splitter, generating a second phase signal, I2, and a second quadrature signal, Q2, wherein the second quadrature signal is in quadrature with the second phase signal;

with a double-quadrature mixer, receiving the first phase signal, I1, and the first quadrature signal, Q1, from the first phase splitter and receiving the second phase signal, I2, and the second quadrature signal, Q2, from the second phase splitter; and with the double-quadrature mixer, generating at least one output signal based on the first phase signal, I1, the first quadrature signal, Q1, the second phase signal, I2, and the second quadrature signal, Q2.

17. The method of claim 16, further comprising:

with a calculation unit, receiving the at least one output signal from the double-quadrature mixer, wherein the at least one output signal comprises a first pair of output signals in the first mode and a second pair of output signals in the second mode; and with the calculation unit, determining one or both of a phase shift of the circuit under test or a gain of the circuit under test based on the first pair of output signals and the second pair of output signals.

18. The method of claim 17, wherein generating the at least one output with the double-quadrature mixer comprises:

with a first mixer, receiving the first phase signal, I1, from the first phase splitter and an output of a third multiplexer;

with a second mixer, receiving the first quadrature signal from the first phase splitter and an output of a fourth multiplexer;

with the third multiplexer, in a third mode, providing the second phase signal, I2, to the first mixer;

with the third multiplexer, in a fourth mode, providing the second quadrature signal, Q2, to the first mixer;

with the fourth multiplexer, in the third mode, providing the second quadrature signal, Q2, to the second mixer; and with the fourth multiplexer, in the fourth mode, providing an inverted version of the second phase signal, −I2, to the second mixer.

19. The method of claim 18, wherein generating the at least one output with the double-quadrature mixer further comprises:

with a summing element, generating the at least one output by summing a first output of the first mixer and a second output of the second mixer.

20. The method of claim 18, further comprising:

with a control unit, selectively controlling first multiplexer and the second multiplexer to operate in the first mode or the second mode; and with the control unit, selectively controlling the third multiplexer and the fourth multiplexer to operate in the third mode or the fourth mode.

* * * * *